United States Patent
Shinoura et al.

(10) Patent No.: US 6,184,680 B1
(45) Date of Patent: Feb. 6, 2001

(54) MAGNETIC FIELD SENSOR WITH COMPONENTS FORMED ON A FLEXIBLE SUBSTRATE

(75) Inventors: Osamu Shinoura; Hideyuki Suzuki; Yuichi Sato, all of Chiba (JP)

(73) Assignee: TDK Corporation, Tokyo (JP)

(*) Notice: Under 35 U.S.C. 154(b), the term of this patent shall be extended for 0 days.

(21) Appl. No.: 09/013,638

(22) Filed: Jan. 26, 1998

(30) Foreign Application Priority Data

| Mar. 28, 1997 | (JP) | 9-095213 |
| Jul. 9, 1997 | (JP) | 9-199353 |
| Jul. 23, 1997 | (JP) | 9-212532 |
| Sep. 30, 1997 | (JP) | 9-282605 |
| Sep. 30, 1997 | (JP) | 9-282606 |

(51) Int. Cl.[7] ............ G01R 33/09; H01L 43/08; G01B 7/30
(52) U.S. Cl. .......... 324/252; 324/207.21; 338/32 R; 428/900
(58) Field of Search ............ 324/173, 174, 324/207.21, 252; 360/113, 324, 326; 338/32 R; 365/158; 428/611, 900

(56) References Cited

U.S. PATENT DOCUMENTS

| 4,949,039 | 8/1990 | Gruenberg . | |
| 5,508,611 | * 4/1996 | Schroeder et al. | 324/207.21 X |
| 5,569,544 | 10/1996 | Daughton . | |
| 5,595,830 | 1/1997 | Daughton . | |
| 5,617,071 | 4/1997 | Daughton . | |
| 5,631,557 | * 5/1997 | Davidson | 324/174 |
| 5,644,230 | * 7/1997 | Pant et al. | 324/252 X |
| 5,861,747 | * 1/1999 | Kubinski | 324/207.21 |
| 5,904,996 | * 5/1999 | Van Der Zaag et al. | 324/252 X |
| 5,916,694 | * 6/1999 | Tokura | 324/252 X |

FOREIGN PATENT DOCUMENTS

| 2-195284 | * 8/1990 | (JP) | 324/207.21 |
| 7-153034 | 6/1995 | (JP) . | |
| 7-273385 | 10/1995 | (JP) . | |
| 8-184463 | * 7/1996 | (JP) | 324/252 |
| 8-201492 | 8/1996 | (JP) . | |

OTHER PUBLICATIONS

S.S.P. Parkin, "Flexible giant magnetoresistance sensors", Appl. Phys. Lett. 69(20), Nov. 11, 1996, pp. 3092–3094.
J. Daughton, et al., "Magnetic Field Sensors Using GMR Multilayer", IEEE Transactions on Magnetics., vol. 30, No. 6, Nov. 1994, pp. 4608–4610.
K. Onaka, et al., "FPM Sensor", National Technical Report, vol. 42, No. 4, Aug. 1996, pp. 465–472.
T. Kawai, et al., "Magnetoresistive Sensors", Journal of Jpn. Appl. Mag., vol. 16, No. 4, 1992, pp. 643–648.

* cited by examiner

Primary Examiner—Gerard Strecker
(74) Attorney, Agent, or Firm—Oblon, Spivak, McClelland, Maier & Neustadt, P.C.

(57) ABSTRACT

A magnetic field sensor in which a magnetic film or films having a magnetoresistance effect for detecting a magnetic field and a conductor electrode film for applying a current to the magnetic film are deposited on a flexible substrate. Therefore, the magnetic field sensor deposited on the flexible substrate can be bent as desired. The magnetic film or films can be deposited on one face of the flexible substrate made of resin that is 5 to 300 μm thick while the other substrate face on the opposite side of the flexible substrate can be brought adjacent to a body inducing a change in a magnetic field that is undergoing detection. be deformed.

15 Claims, 22 Drawing Sheets

λ : MAGNETIC-FIELED PITCH

MAGNETIC FIELD SENSOR WITH COMPONENTS FORMED ON A FLEXIBLE SUBSTRATE

BACKGROUND OF THE INVENTION

1. Field of the Invention

The present invention relates to a magnetic field sensor which is provided with a magnetic field detecting element for detecting an external magnetic field change and, in particular, to a magnetic field sensor for detecting rotation and position.

2. Description of the Prior Art (1) A magnetoresistance effect element is an element for measuring a magnetic field intensity by using a phenomenon (magnetoresistance effect, i.e., MR effect) in which an electric resistance of a ferromagnetic metal changes with an external magnetic field change. For a single-layer magnetic film, a heretofore known anisotropic magnetoresistance effect has been used. Recently, as disclosed in, for example, publications of patent application laid-open Nos. Hei 5-259530 and 7-77531, another element is developed by using a giant magnetoresistance effect (hereinafter referred to as the GMR effect) of a magnetic film with a multilayered structure.

Also, as introduced in National Technical Report, Vol. 42, No. 4, pp. 465–472, a VTR capstan motor rotation detecting sensor uses a NiFeCo/Cu multilayered film as a GMR effect element. By detecting a magnetic field change from a multipolar magnetic rotor, the magnetic field sensor, as a result, detects a rotational speed in a non-contact manner. Therefore, in this magnetic field sensor, it is very important to minimize a distance (gap) of the magnetoresistance effect film as a detecting portion from the magnetic rotor. For this, the technical report discloses a structure in which inside through holes formed in an alumina substrate AgPd are used to print an electrode draw portion on a rear face of a substrate. Also, in a magnetic field sensor using Hall element which is introduced in National Technical Report, Vol. 42, No. 4, pp. 480–488, to realize a surface mounting thickness of 200 $\mu$m or less, TAB (tape automatic bonding) mounting is performed on a substrate with a magnetic field detecting element formed thereon, to draw an electrode by using a CU foil lead. However, in such a conventional method, process is complicated, thereby increasing cost.

Also, in Japanese Applied Magnetics Journal, 1992, Vol. 16, pp. 643–648 it is described that in a conventional magnetic field detecting element constituted of a magnetic thin film deposited on a hard substrate since a magnetic property of the magnetic film changes with a magnetic elasticity effect produced by an unavoidable stress from the substrate or a protective film, various attempts are necessary when the change is considered. Especially, a thermal stress is an important factor which influences the magnetic property. By sufficiently considering a film-forming temperature and an operation temperature, the magnetic element needs to be designed. Further, the magnetic property of magnetoresistance effect film often needs to be finely optimized in accordance with various product specifications. As a result, products are diversified, thereby complicating a process control.

(2) As aforementioned, National Technical Report, Vol. 42, No. 4, page 465 introduces the VTR capstan motor rotation detecting sensor which uses the NiFeCo/Cu multilayered film as the GMR effect element.

Also, as a prior-art magnetic field detecting element, the publication of patent application laid-open No. Hei 7-77531 discloses a magnetic position detecting element and a rotation detecting element, in which a magneto-sensitive pattern using a GMR effect is disposed at a magnetic-field pitch $\lambda/2$ or $\lambda/4$ of a detected body.

As another prior-art magnetic field detecting element, a publication of patent application laid-open No. Hei 1-297508 discloses a magnetic sensor in which four magneto-sensitive patterns are disposed to have a constant relationship with a magnetic-field pitch of a detected body.

Plural magneto-sensitive patterns are disposed so as to have a predetermined relationship with the magnetic-field pitch of the detected body. A differential magnetic field detecting element constituted in this manner is heretofore known broadly.

However, for example, as shown in FIG. 25, a magnetic field detecting element 100, which is heretofore proposed as aforementioned, is constituted of two thin-film patterns (magneto-sensitive pattern portions) 111 and 115 for detecting a magnetic field. These films are formed on a substantially flat common substrate (e.g., wafer substrate) 110 with a predetermined distance D therebetween which is determined by considering a magnetic-field pitch of a detected body. Numeral 120 denotes electrode pads for applying a current.

According to the prior-art constitution, however, for the purpose of making multiple magnetic field detecting elements 100, when plural magnetic field detecting elements 100 are formed altogether on the wafer substrate having a constant area, the number of magnetic field detecting elements 100 which can be deposited on the wafer substrate cannot be increased.

Also, when there are plural types of magnetic-field pitches of the detected body, the magneto-sensitive patterns need to be disposed and formed with different intervals formed thereamong in accordance with the magnetic-field pitches. To form the patterns on the magnetic field detecting element 100, masks and the like must be prepared beforehand in accordance with the magnetic-field pitches. Therefore, various types of masks and the like are necessary for each of the multiple detected bodies.

Also, the conventional magnetic field detecting element 100 has the following operational problem. To depict the problem, FIG. 24 shows an operation example of the conventional magnetic field detecting element 100. The magnetic field detecting element 100 is dispose spaced from the teeth of soft magnetic body rotary gear 160 as illustrated in FIG. 24. On the magnetic field detecting element 100 a permanent magnet 170 is disposed. A magnetic flux from the permanent magnet 170 changes with a positional relationship with the rotary gear 160. The condition of the change is detected by the magneto-sensitive pattern portions 111 and 115 which are formed with the predetermined interval D therebetween. In this case, the direction of a variation in magnetic-field pitch is, i.e. the smaller pattern line widths Pw of the magneto-sensitive pattern portions 111 and 115 in an x-direction in which the rotary gear 160 rotates are, the better. This is because a differential operation is preferable at a point where a difference in magnetic field to be detected is the largest. However, in the conventional magnetic field detecting element 100, as shown in the drawing, since the pattern line is folded plural times, an actual magnetic field detecting region is distributed in the x-direction. Therefore, if the magnetic-field pitch of the detected body is narrow, the magnetic field to be originally detected cannot be detected in some case.

(3) As aforementioned, the magnetic field sensor is a device for converting an external magnetic field change into an electric signal, and is constituted by patterning a ferromagnetic body and a semiconductor thin film to form an element which converts the external magnetic field change as a voltage change into the electric signal when a current is applied to the thin-film pattern. For example, the magnetoresistance effect film measures a magnetic field intensity using a phenomenon (MR effect) in which the electric resistance of a ferromagnetic metal changes with the external magnetic field. For the single-layer magnetic film, a heretofore known anisotropic magnetoresistance effect of the ferromagnetic metal film has been used. Recently, however, the GMR effect element constituted of the multilayered film structure has been reported. For example, as introduced in National Technical Report, Vol. 42, No. 4, page 465, the VTR capstan motor rotation detecting sensor uses a NiFeCo/Cu multilayered film as the GMR effect element. Also, in National Technical Report, Vol. 42, No. 4, page 84 disclosed is a semiconductor magnetic field detecting sensor which uses an InSb thin film.

A general structure of a heretofore used magnetic field sensor is shown in FIG. 26. As shown in FIG. 26, on one face 210a of a substrate 210 formed are a thin-film pattern 220 for detecting a magnetic field and electrodes 230 interconnected thereto. Further on these elements, a protective film 208 is disposed for protecting the elements. In the structure, the protective film 208, i.e. the substrate face 210a with the thin-film pattern 220 formed thereon is opposed to a detected body 270. Further, in the conventional magnetic field sensor, through holes 233 are formed in the substrate 210. Via conductive bodies 233a filled in the through holes 233, portions are solder-bonded and lead wires 235 are connected to a rear face 210b of the substrate 210 through bonds 234. In this manner, by minimizing a distance G1 between the thin-film pattern 220 and the detected body 270, a sensitivity is improved. If the solder-bonded portions and the lead wires are exposed on the surface of the substrate 210, the distance G1 cannot be minimized.

However, the structure provided with the through holes 233 and the protective film 208 formed on the thin-film pattern 220 is remarkably complicated, thereby deteriorating the productivity and increasing the manufacture cost. Further, to improve the sensitivity, the protective film 208 cannot be formed very thick. Also the formed protective film 208 itself is not very rigid. In some case there arises a problem with respect to weatherability. Additionally, in FIG. 26 numeral 260 denotes a permanent magnet, which is filled and sealed with a resin 261 in a shield case 265.

Another prior art of the invention is disclosed in a publication of patent application laid-open No. Sho 63-196874. The publication discloses a magnetoresistance effect sensor provided with a thin-film pattern formed on a surface of a substrate for detecting a magnetic field. On the other hand, a rear face of the substrate is used as a detecting face which is opposed to a detected body. According to the prior art, connected portions are prevented from rising or otherwise. Therefore, the distance from the detected body can be minimized and the sensitivity is increased. Further, the sensor can be manufactured with good yield and inexpensively.

However, the substrate disclosed in the patent application laid-open No. Sho 63-196874 is a glass substrate, which is relatively easily broken. An originally thin glass substrate cannot be used. Therefore, after a magnetic-field detecting thin-film pattern is once formed on a relatively thick substrate, a rear face of the glass substrate needs to be processed thin by grinding, polishing and etching. The process is remarkably laborious. Also, since the processed glass substrate is thin, its mechanical strength is unstable. The glass substrate may still be broken by a slight vibration or the like during the process. Further, in the prior art, no measure is taken for radiating heat which is generated in the magnetic-field detecting thin-film pattern during operation.

(4) As aforementioned, the magnetic field sensor converts the external magnetic field change into the electric signal. By patterning the ferromagnetic body, the semiconductor thin film or another magnetic field detecting thin film and applying a current to the thin-film pattern, the external magnetic field change is converted as the voltage change into the electric signal.

For example, the ferromagnetic magnetoresistance effect sensor measures a magnetic field intensity by using the phenomenon (MR effect) in which the electric resistance of the ferromagnetic metal changes with the external magnetic field.

For the single-layer magnetic film, the heretofore known anisotropic magnetoresistance effect of the ferromagnetic metal film has been used. Recently, as disclosed in the publications of patent application laid-open Nos. Hei 5-259530 and 7-77531, also developed is a magnetic field sensor which uses a combined type of great magnetoresistance effect (GMR effect) of a magnetic film with a multilayered structure.

Also, as introduced in National Technical Report, Vol. 42, No. 4, page 465, the VTR capstan motor rotation detecting sensor uses the NiFeCo/Cu multilayered film as the GMR effect element.

The GMR effect film is usually formed on a hard substrate of silicon, glass or the like. However, in Appl. Phys. Lett. (69) pp. 3092–3094 (1996), another attempt is described in which a spin valve structure film exhibiting a GMR effect is formed on an organic film. As compared with the hard substrate, the organic film is less expensive and can be easily cut, separated or processed otherwise when forming an element. The organic film advantageously contributes largely to a reduction in manufacture cost.

The present known GMR effect film is largely classified into ① an antiferromagnetic-coupled type having a ferromagnetic body/nonmagnetic conductor structure, ② an induction ferri (non-coupled) type having a high coercive-force ferromagnetic body/nonmagnetic conductor/low coercive-force ferromagnetic body structure, ③ a spin valve type having an antiferromagnetic body/ferromagnetic body/nonmagnetic conductor/ferromagnetic body structure and ④ a Co/Ag non-solid solution system granular type.

These GMR effect films are largely different from one another in magnetic field intensity to be detected, i.e. the saturation magnetic field intensity of the magnetoresistance effect, because of their structures and compositions. Therefore, when designing an actual GMR effect film, to obtain a maximum magnetic sensitivity in accordance with the magnetic field intensity to be detected, first a basic form is selected from various GMR effect films. Then, the composition system needs to be modified and further a fine structure thereof needs to be optimized.

Among the above GMR effect films, ① the antiferromagnetic-coupled type having the ferromagnetic body/nonmagnetic conductor structure or ② the induction ferri (non-coupled) type having the high coercive-force ferromagnetic body/nonmagnetic conductor/low coercive-force ferromagnetic body structure is so-called a GMR effect multilayered film. By laminating 10 to 100 layers of remarkably thin films with a layer thickness of 10 nm or less, a large magnetoresistance effect can be obtained.

In contrast, because the above ③ spin valve type uses a resistance change along a spin direction between two magnetic layers, the thickness of each magnetic layer exceeds 10 nm. Since this type has a small number of layers, it is also called a sandwich type. The aforementioned GMR effect film disclosed in the Appl. Phys. Lett. (69) pp. 3092–3094 (1996) is of the spin valve type.

The aforementioned ① coupled type or ② induction ferri-type GMR effect multilayered film has an appropriate detection magnetic field value of several hundreds of Oe. Therefore, this film is preferably used as the magnetic field sensor. Also, as aforementioned, the organic film starts to be introduced as the substrate.

However, it has been remarkably difficult to form the GMR effect multilayered film with 10 to 100 layers each having a thickness of 10 nm or less laminated therein on the flexible substrate of resin and thus obtain a high MR change ratio. Specifically, the flexible substrate of resin has a much smaller thermal conductivity as compared with the hard substrate of silicon, glass or the like. When the GMR effect multilayered film is formed on the flexible substrate of resin by sputtering or another vacuum film-forming process, the surface of the substrate with the multilayered film actually formed thereon tends to have a high temperature even if the substrate is cooled from the rear face thereof. Therefore, constituent elements are diffused among the layers of the multilayered film during the film formation, and smooth interlayer faces cannot be obtained. This tendency or problem prominently arises especially when forming the GMR effect multilayered film which is obtained by laminating 10 to 100 layers of remarkably thin films having a layer thickness of 10 nm or less.

SUMMARY OF THE INVENTION

For solving the foregoing prior-art problems, the present invention has been created.

Specifically, to solve the aforementioned prior-art problem (1), a first aspect of the invention has been developed. An object of the invention is to provide a magnetic field sensor which uses an inexpensive substrate and realizes a structure free of projecting portions (protrusions) inhibiting magnetic field detection on a surface with a magnetic film as a magnetic field detecting portion formed thereon and to manufacture a magnetic field sensor superior in weatherability in a simple process. Another object is to provide a magnetic field sensor in which by applying an appropriate stress to a magnetic film formed on a flexible substrate when the substrate is deformed, a magnetic property can be easily optimized in accordance with respective product specifications by using a magnetic elasticity effect. Further object is to provide a so-called differential operation type of magnetic field sensor in which at least two or more magnetic films are disposed with a predetermined interval therebetween. In this case, by arbitrarily changing the interval between the magnetic films, various optimum measurement specifications can be set. To attain these objects, the first aspect of the invention provides a magnetic field sensor in which on a flexible substrate a magnetic film having a magnetoresistance effect for detecting a magnetic field and a conductor electrode film for applying a current to the magnetic film are disposed and formed.

To solve the aforementioned prior-art problem (2), a second aspect of the invention has been developed. An object of the invention is to provide a magnetic field sensor which can have a high detecting sensitivity even when a magnetic-field pitch to be detected is narrowed and which can be efficiently manufactured in multiple. Another object is to provide a magnetic field sensor in which an interval between magneto-sensitive pattern portions can be easily adjusted in accordance with a change in magnetic-field pitch to be detected. To attain the objects, the second aspect of the invention provides a magnetic field sensor having plural magneto-sensitive pattern portions for detecting a magnetic field. At least one magneto-sensitive pattern portion and the other magneto-sensitive pattern portion are disposed in an opposed positional relationship on different planes.

To solve the aforementioned prior-art problem (3), a third aspect of the invention has been developed. An object of the invention is to provide a magnetic field sensor which has a simple structure, can be inexpensively manufactured and has a high detecting sensitivity. Another object is to provide a magnetic field sensor which can have a sufficient radiating effect on a heat generated from a magnetic-field detecting thin-film pattern during operation, which is a large problem when a substrate having a low thermal conductivity is used. To attain these objects, the third aspect of the invention provides a magnetic field sensor which is provided with a thin-film pattern for detecting a magnetic field on a substrate. In the magnetic field sensor, the magnetic-field detecting thin-film pattern is deposited on one face of the flexible substrate of resin with a thickness of 5 to 300 $\mu$m, and the other face of the flexible substrate is constituted as a detecting face to be opposed to a detected body.

To solve the aforementioned prior-art problem (4), a fourth aspect of the invention has been developed. An object of the invention is to deposit multiple layers each having a thickness of 10 nm or less on a flexible substrate of resin, which has been difficult to use as a substrate, while controlling mutual diffusion among the layers to form a great magnetoresistance effect multilayered film having smooth interlayer faces and then to process a device to provide a magnetic field sensor which has a remarkably high magnetoresistance change ratio(hereinafter, referred to as the MR ratio). To attain this object, the fourth aspect of the invention provides a method of manufacturing a magnetic field sensor which has on a substrate a magnetoresistance effect film. As the substrate used is the flexible substrate of resin with a k/L value of $1.5 \times 10^3 (W \cdot m^{-2} \cdot K^{-1})$ or more, in which K is a thermal conductivity and L is a substrate thickness. The flexible substrate of resin is mounted on a substrate fixed base. While cooling the flexible substrate of resin from the substrate fixed base, as the magnetoresistance effect film the GMR effect multilayered film with multiple layers each having a thickness of 10 nm less deposited therein is formed by a vacuum film-forming process.

DETAILED DESCRIPTION OF THE INVENTION

Preferred embodiments of the invention are now described with reference to the drawings.

(1) First Aspect of the Invention

Figure 1:
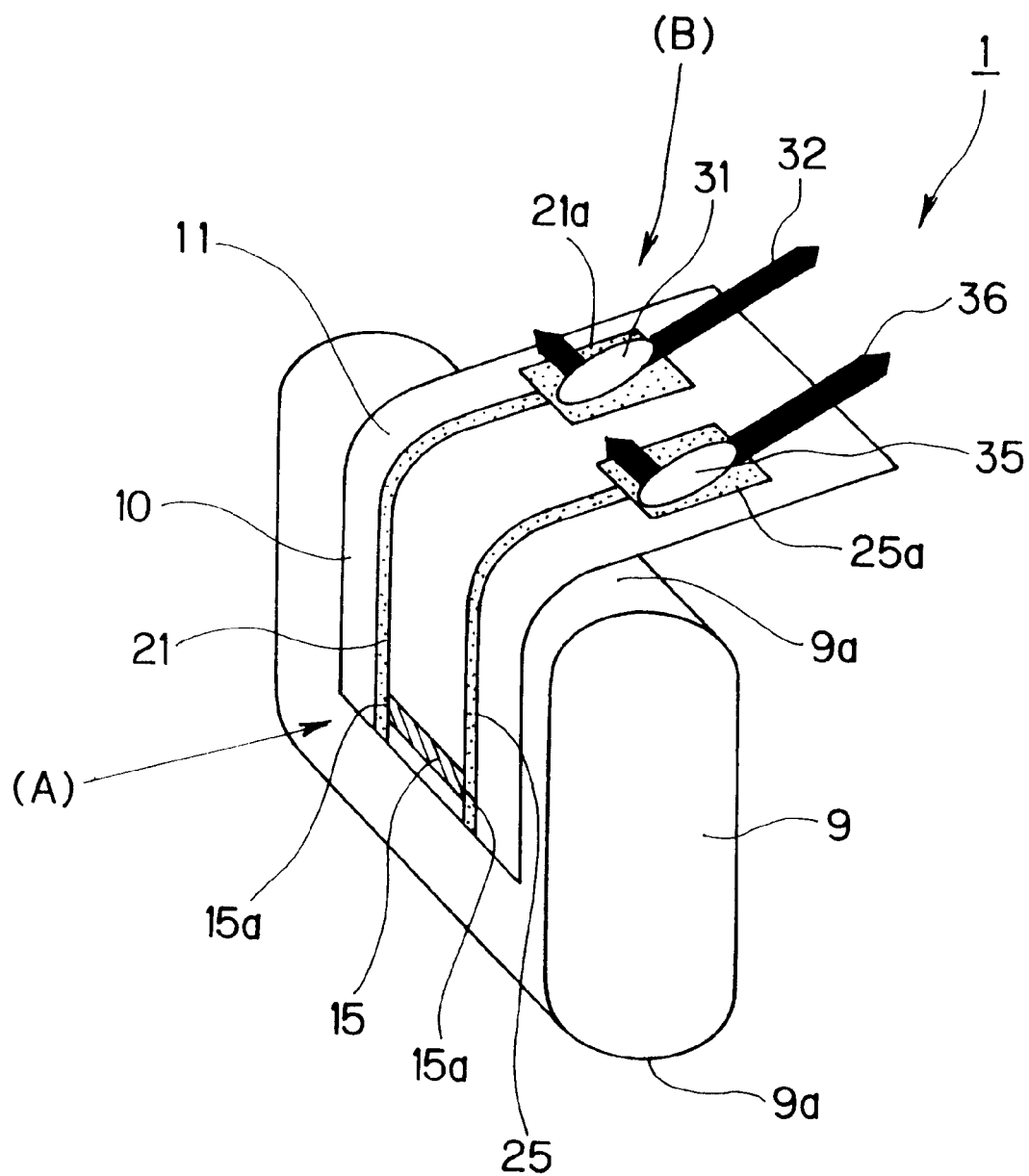
FIG. 1 is a perspective view showing a preferred embodiment of a magnetic field sensor according to the present invention.

FIG. 1 is a perspective view showing a preferred embodiment of a magnetic field sensor 1 according to the invention. As shown in FIG. 1, in the magnetic field sensor 1 on a flexible substrate 10 arranged and formed are a magnetic film 15 having a magnetoresistance effect for detecting a magnetic field and conductive electrode films 21 and 25 connected to the magnetic film 15 for applying a current thereto. Here, the magnetic film 15 and the conductive electrode films 21 and 25 are at least partly formed on the flexible substrate 10, respectively.

The magnetic film 15 is usually formed in a predetermined pattern for detecting the magnetic field (a linear pattern in the embodiment of FIG. 1). Both ends 15a are connected respectively to the conductive electrode films 21 and 25. The conductive electrode films 21 and 25 are also provided with predetermined electrode patterns. Usually on respective ends of the conductive electrode films 21 and 25, external connecting portions (electrode pad portions) 21a and 25a are formed as shown in the drawing. Via the external connecting portions 21a and 25a, the conductive electrode films 21 and 25 are soldered, wire-bonded or bonded otherwise to an external circuit. In FIG. 1, the conductive electrode films are soldered. Specifically, connection lines 32 and 36 are bonded via solders 31 and 35 to the external connecting portions 21a and 25a, respectively.

It is natural that the magnetic field sensor of the invention can be used without bending the flexible substrate 10 forming its base. However, to use the characteristic of the flexible substrate 10, when the flexible substrate 10 is appropriately bent for use, the application range and obtainable effect of the elements will be enlarged.

Figure 3:
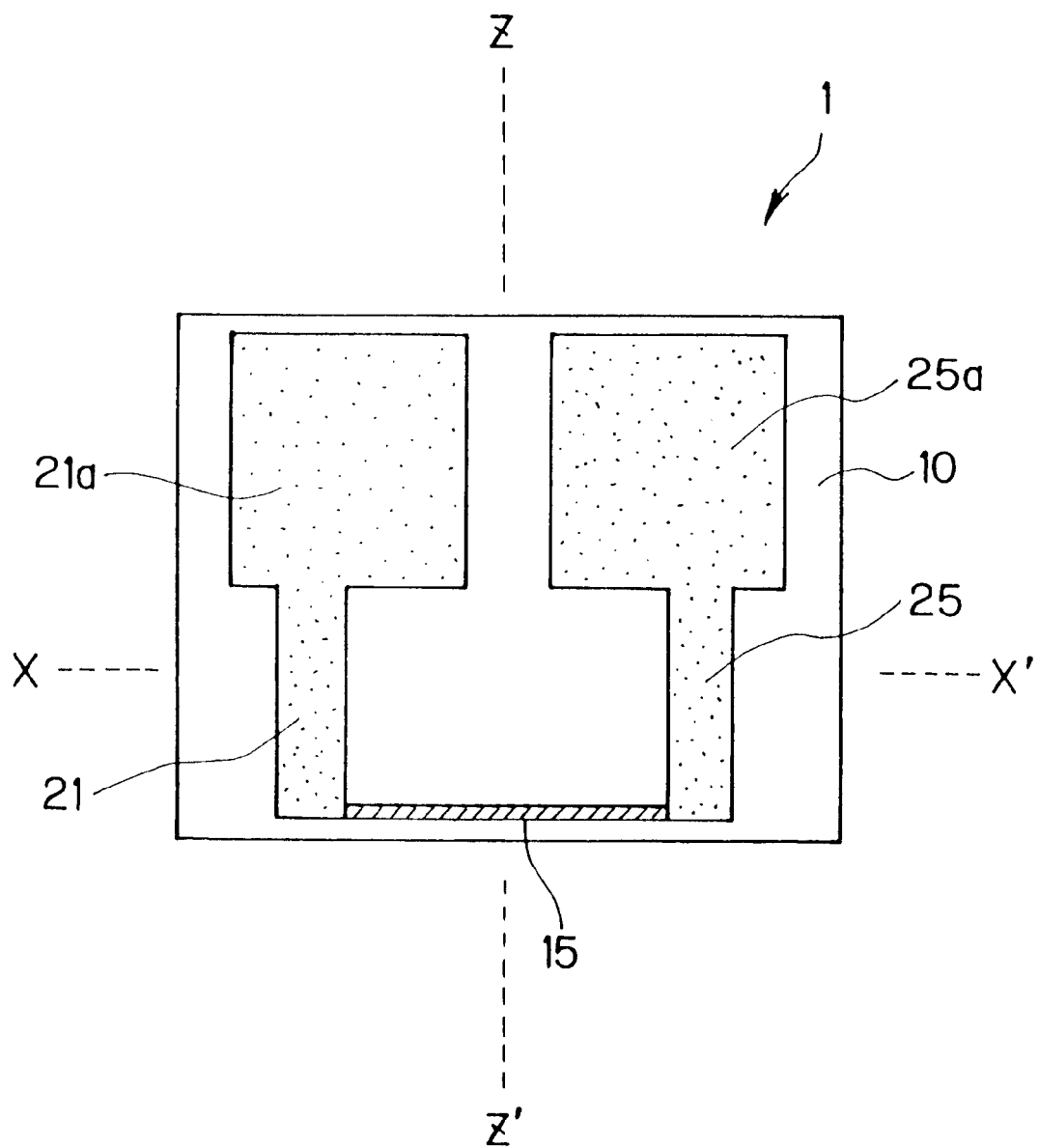
FIG. 3 is a plan view schematically showing a flexible substrate before curved.

In the embodiment shown in FIG. 1, the flexible substrate 10 is curved by using a planar auxiliary member 9 provided with curved portions 9a. A place on which the magnetic film 15 is formed remains flat. Also, FIG. 3 is a diagrammatic plan view showing the flexible substrate 10 before being curved as shown in FIG. 1. By curving the planar magnetic field sensor shown in FIG. 3 along line X–X', the magnetic field sensor shown in FIG. 1 can be obtained.

Figure 2:
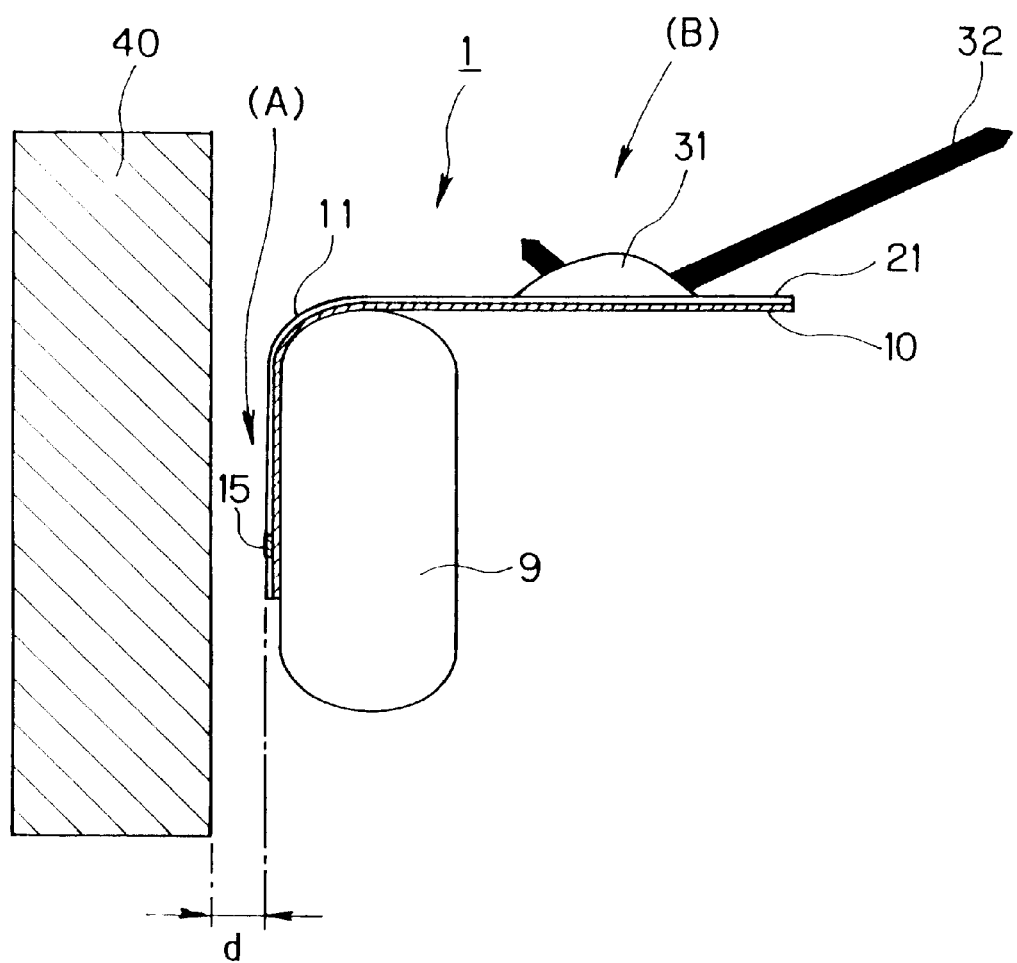
FIG. 2 is a sectional view showing a concrete operation state of the magnetic field sensor.

FIG. 2 is a sectional view showing a concrete operation state of the magnetic field sensor shown in FIG. 1. The magnetic film 15 as the magnetic-field detecting portion is mounted and used, for example, at a distance d from an external magnetic-field generating portions 40 or from a ferromagnetic body 40 which causes a magnetic field change.

When the distance d is increased, magnetic field intensity and detecting resolution are decreased. Therefore, it is important that on a plane on which the pattern of the magnetic film 15 constituting the magnetic field detecting portion is deposited there is no protruded portion (convex portion) which inhibits the magnetic field detection. In the magnetic field sensor 1 of the invention, as shown in FIGS. 1 and 2, by bending the portions on which the magnetic film 15 is not formed, a curved portion 11 is preferably formed. In this preferable constitution, since the surface with the magnetic film 15 formed thereon has no protruded portion (convex portion) which inhibits the magnetic field detection, the distance d can be remarkably minimized.

The flexible substrate 10 for use in the invention is preferably superior in so-called flexibility, thin and light. For example, a substrate similar to a plastic film for broad use as a printed wiring plate or the like can be used. Specifically, available are various materials known as plastic film materials, e.g. polyimide, polyethylene terephthalate (PET), polypropylene (PP), Teflon and the like. Above all, a polyimide film having a high thermal resistance is preferable when considering that it is solder-bonded to the end of the conductive electrode film.

The thickness of the flexible substrate 10 is not restricted, usually preferably 1 to 200 µm and especially preferably 10 to 150 µm. If the thickness is less than 1 µm and the substrate becomes excessively thin, then the substrate lacks its inherent strength. If the thickness exceeds 200 µm and the substrate becomes excessively thick, then the flexibility is deteriorated and a desired amount of bending becomes difficult.

The flexible substrate 10 for use in the invention fails to break even when it is thin. Therefore, on its surface the magneto-sensitive element (magnetic field sensor) can be formed, while its rear face can be opposed to the external magnetic-field generating portion 40 or the ferromagnetic body 40 which causes a magnetic field change. This structure (hereinafter, referred to as the structure with the substrate 10 interposed therein) can be selected. In this case, although the thickness of the flexible substrate 10 is added to the distance d, the flexible substrate 10 is so thin that it does not affect the magneto-sensitive effect. For example, when the distance equals 1 mm and the thickness of the flexible substrate 10 is 50 µm, the total amounts only to 1.05 mm. Especially, when the magnetic field sensor is required to have corrosion resistance, the structure with the substrate 10 interposed therein is preferable because the substrate 10 substantially forms a protective film. Also, an external electrode can be largely protruded from a magneto-sensitive element face. To make effective the structure with the substrate 10 interposed therein, the thickness of the flexible substrate 10 is preferably 200 µm or less, most preferably 75 µm or less. The structure with the substrate 10 interposed therein cannot be realized until the flexible substrate 10 of the invention is used. The heretofore used non-flexible substrate of glass, silicon, ceramic or the like has a high possibility of breaking during the manufacture process, and cannot realize the aforementioned structure.

Also, the plastic film which is used as the flexible substrate 10 is less expensive than an alumina substrate or a glass substrate, and can be easily cut or separated when forming an element. The plastic film also advantageously contributes largely to a reduction in product price.

The magnetic-field detecting magnetic film 15 for use in the invention may be a magnetoresistance effect film which has either a single-layer or multilayered film structure. In the phenomenon of the magnetoresistance effect, electric resistance changes as magnetic field changes. The magnetic film 15 may be an ferromagnetic film exhibiting an anisotropic magnetoresistance effect (anisotropic magnetoresistance effect film) without problem. Especially preferable is a GMR effect film which has a high detecting sensitivity and can largely change magnetic field intensity. The GMR effect film is, as introduced in Metal Artificial Lattice (Hiroyasu FUJIMORI, AGNE Technical Center, published in 1995), page 347, a multilayered film constituted of ferromagnetic films and nonmagnetic films. It is known that a change in interface diffusion in the multilayered film causes a change in resistance.

The GMR effect film is largely classified into ① an antiferromagnetic-coupled type having a ferromagnetic body/nonmagnetic conductor structure, ② an induction ferri (non-coupled) type having a high coercive-force ferromagnetic body/nonmagnetic conductor/low coercive-force ferromagnetic body structure, ③ a spin valve type having a semi-ferromagnetic body/ferromagnetic body/nonmagnetic conductor/ferromagnetic body structure and ④ a Co/Ag non-solid solution system granular type.

These GMR effect films are largely different from one another in magnetic field intensity to be detected, i.e. the saturation magnetic field intensity of the magnetoresistance effect, because of their structures and compositions. For example, an Fe/Cr system antiferro type can detect a magnetic field of 10 KOe or more, a CoNiFe/Cu system antiferro type 0.10 e to 1 KOe, an NiFe/Cu/Co/Cu system induction ferri type about 50 e to 200 e, an FeMn/NiFe/Cu/NiFe system spin valve type several Oe, and a granular type about 1000 e to 5 KOe. The magnetic sensitivity is obtained by dividing the maximum MR change ratio by the saturation magnetic-field intensity. Even when the maximum MR change ratio is large, the magnetic sensitivity is deteriorated if the saturation magnetic field is large. Conversely, even when the maximum MR change ratio is small, the magnetic sensitivity is good if the saturation magnetic field is small. Therefore, to obtain an optimum magnetic sensitivity in accordance with the magnetic-field intensity to be detected, from the aforementioned various GMR effect films, a basic system is first selected. Then, the composition system is changed or a fine structure is optimized.

The resistance of the GMR effect film is changed with an in-plane parallel magnetic field. The conventional anisotropic magnetoresistance effect film detects only the magnetic field of the specified direction, while the GMR effect film can basically detect the in-plane magnetic field irrespective of the direction. However, only the spin valve type of GMR effect film can detect the magnetic field of the specified direction in the same manner as the conventional anisotropic magnetoresistance effect film. According to the invention, the film, which is formed on the flexible substrate, can be easily bent. However, in some case by the bending process the magneto-sensitive composition which has been straight in a plane might be deformed or curved. Therefore, preferable is a structure for isotropic detection of an in-plane magnetic field. Also, a rotation detecting magnetic field sensor usually detects a magnetic field of about 500 e to 5000 e. In this case, a combination of the antiferromagnetic-coupled type of GMR effect film with the flexible substrate is especially preferable.

The magnetoresistance effect film (the magnetic film 15) is formed by a vacuum film-forming process such as evaporation, sputtering or the like. Specifically, after the magnetoresistance effect film is formed all over the flexible substrate 10, the film is patterned into a desired pattern to form the magnetic-field detecting magnetic film 15. Further, the conductive electrode films (electrodes) 21 and 25 are formed in predetermined patterns to be connected to the magnetic film 15 for applying a current thereto. It is important that the conductive electrode films 21 and 25 have a smaller resistance than the magnetic film 15 as the magnetoresistance effect film. To do this, each of the conductive electrode films 21 and 25 is formed to have a rather large thickness of, for example, 0.3 to 5.0 µm by using a highly conductive metal, for example, copper, gold, aluminum or the like. To form the conductive electrode films 21 and 25, in addition to the vacuum film-forming process, a wet film-forming process can be used. Alternatively, after the conductive electrode films 21 and 25 are formed, the magnetic film 15 (the magnetoresistance effect film) can be formed. As aforementioned, the magnetic film 15 and the conductive electrode film 21 or 25 are individually constituted of different materials. Alternatively, the magnetic film 15 and the conductive electrode films 21 and 25 can be integrally formed (into a film) of the same material. However, in this case, the magnetic film 15 and the conductive electrode films 21 and 25 need to be formed of the same material within a range in which they can fulfill respective functions. Although the magnetic film is of a magneto-sensitive portion, the conductive electrode films do not need to be magneto-sensitive portions. Therefore, to vary a current density in the magneto-sensitive pattern portion and the electrode portion, the electrode portion is designed broader than the magneto-sensitive pattern portion. Specifically, by enlarging the width of both ends of the pattern constituted of the same material, the function of the conductive electrode film can be provided. Since the same material is used, the magnetic film 15 as the magneto-sensitive portion and the conductive electrode films 21 and 25 as the electrode portions can be simultaneously formed by one patterning process, thereby realizing a remarkably high productivity. This is similarly applied to all the embodiments described later.

The magnetic film 15 (magnetoresistance effect film) is usually formed as a film with a thickness of 200 nm or less, which often raises a problem of corrosion resistance in an operation environment. To solve the problem, at least on the magnetic film 15 a protective film is provided, and the magnetic film 15 is preferably protected from the environment. For the protective film, polyimide resin or novolak resin is preferable. Especially, when the polyimide film is used as the flexible substrate 10, the protective film of polyimide resin is preferable. Also, by changing the thickness of the resin layer formed as the protective film, a stress applied to the magnetic film 15 (magnetoresistance effect film) can be varied. Further, under the resin layer formed as the protective film, $SiO_2$, $Al_2O_3$ or another thin film can be provided for protecting the magnetic film 15 (magnetoresistance effect film) in dual. This further reinforces the function of the protective film. Additionally, the surface of the magnetic film 15 is coated with the polyimide resin or the novolak resin (for example, by a spin coating process) and then thermally cured. After the thermal treatment, the novolak resin gains a structure similar to that of bakelite and assures a high corrosion resistance.

Figure 4:
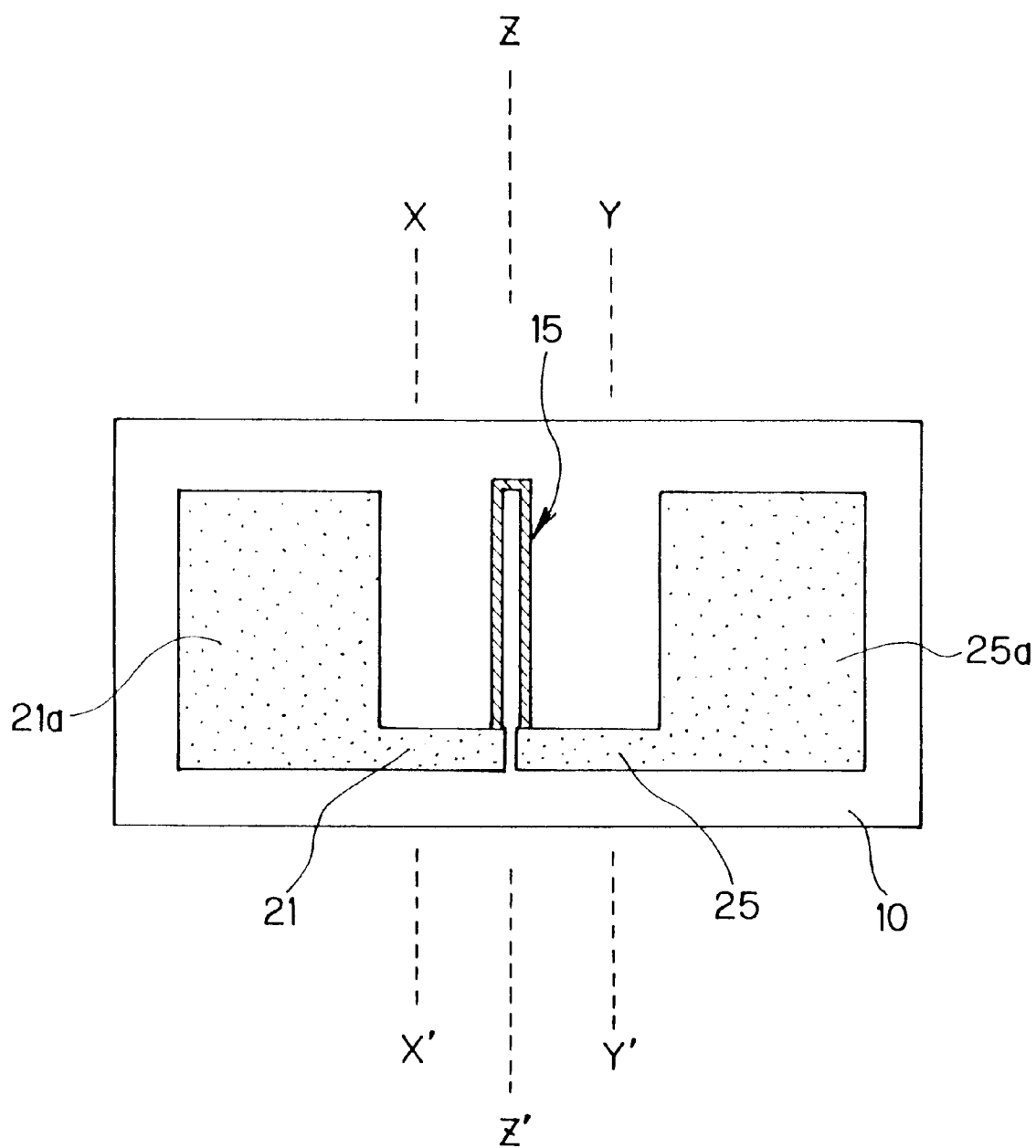
FIG. 4 is a plan view schematically showing a flexible substrate before curved.
Figure 5:
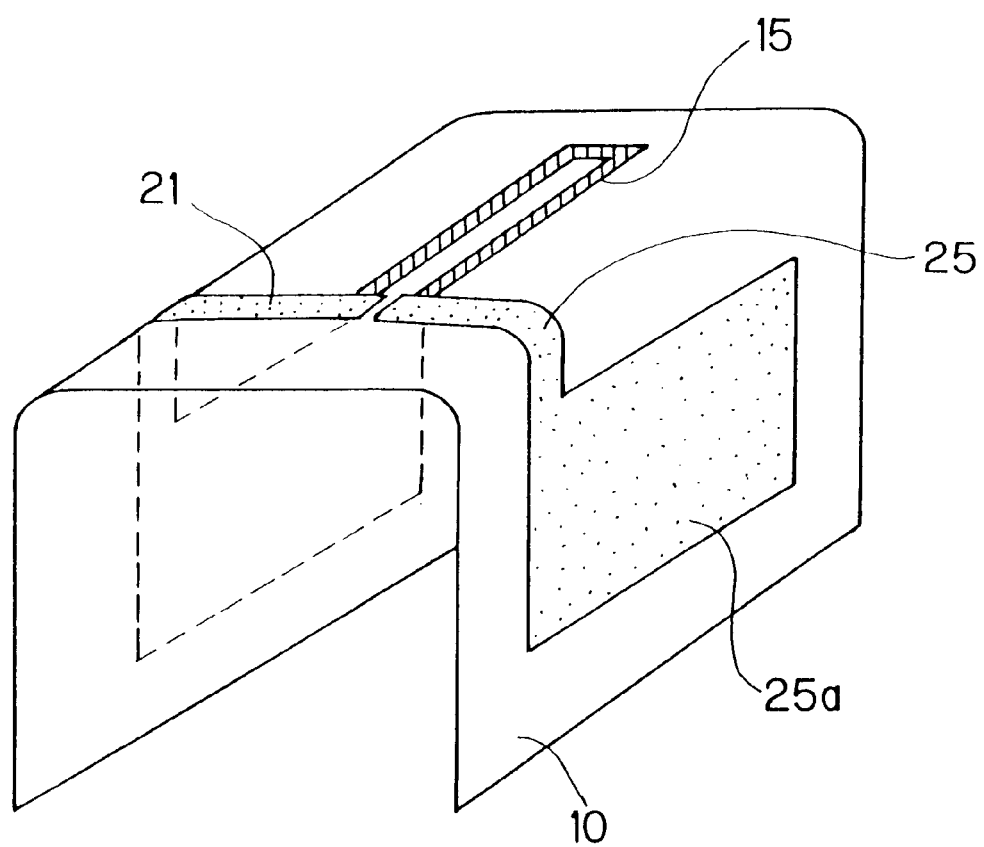
FIG. 5 is a perspective view showing a magnetic field sensor which is formed by curving the planar magnetic field sensor shown in FIG. 4 along two lines X–X' and Y–Y'.
Figure 6:
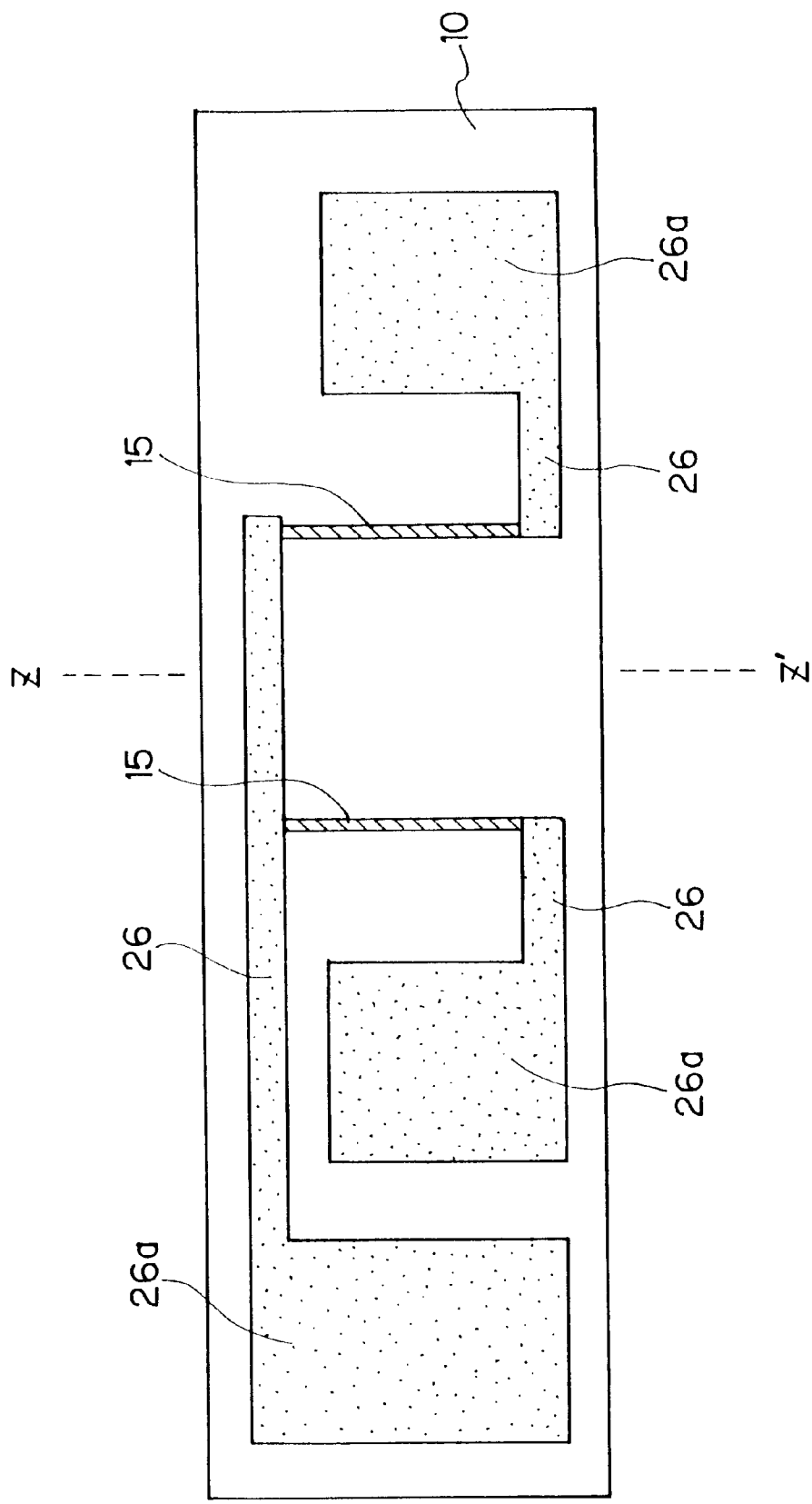
FIG. 6 is a plan view showing a differential operation type of magnetic field sensor which is provided with two or more magnetic-field detecting magnetic films (ferromagnetic pattern portions) for detecting a difference in resistance therebetween.

As aforementioned, in the constitution of the magnetic field sensor 1 according to the invention, on the flexible substrate 10 formed and arranged are the magnetic film 15 having the magnetoresistance effect and the conductive electrode films 21 and 25 for applying a current to the magnetic film 15. Thus, by applying a force from the outside, the flexible substrate 10 can be easily bent. Specifically, as shown in FIGS. 1 and 2. the structure can be easily prepared in which a portion (A) with the magnetic film 15 formed thereon for detecting the magnetic field is not positioned in the same plane as a plane of at least a portion (B) of the conductive electrode films 21 and 25 (e.g. the portion with the external connecting portions 21a and 25a formed thereon). Therefore, without performing a conventional complicated substrate through-hole process, TAB process or the like, the electric connection to the outside can be performed, thereby achieving a large reduction in cost. A modification of the aforementioned magnetic field sensor 1 according to the invention is shown in FIGS. 4 and 5. FIG. 4 is a plan view diagrammatically showing the flexible substrate 10 before being curved. FIG. 5 is a perspective view of a magnetic field sensor which is obtained by curving the planar magnetic field sensor shown in FIG. 4 along two lines X–X' and Y–Y'. In FIG. 5, a film formed portion of the magnetic film 15 constitutes a flat portion. The magnetic field sensor of FIG. 5 provided with two curved portions can provide the same effect as that of the magnetic field sensor shown in FIG. 1. The same numerals substantially denote the same members. In the aforementioned embodiment, the provision of one magnetic film 15 has been described. Alternatively, in accordance with the type of the external magnetic field to be detected, as shown in FIG. 6, two or more magnetic films 15 for detecting the magnetic field (ferromagnetic film pattern portions) can be provided to form a differential operation sensor for detecting a difference in resistance between the films 15. Additionally, in FIG. 6, numeral 26 denotes conductive electrode films and 26a denotes external connection portions (electrode pad portions).

As the magnetic film 15, the magnetoresistance effect film or the GMR effect multilayered film is constituted of a ferromagnetic thin film as aforementioned. The ferromagnetic body changes in anisotropy with a magnetic elasticity effect. The magnetically elastic anisotropy constituted of a product of the magnetostriction of the magnetic body and the stress applied thereto largely varies the magnetic anisotropy of the magnetic film in the same manner as induction magnetic anisotropy, configuration anisotropy or another anisotropy. The degree of the magnetic anisotropy is one of important factors which determine the saturation magnetic field in the magnetoresistance effect film. Simply, the anisotropic magnetic field of the magnetic film forms the saturation magnetostriction in the magnetoresistance effect.

Therefore, when designing the magnetic film 15 in the magnetic field sensor according to the invention, a film for a small anisotropic magnetic field is used to measure a low magnetic field, while a film for a large anisotropic magnetic field is preferably used when a relatively large magnetic field needs to be measured. In the conventional magnetic field sensor, the anisotropic magnetic field has been managed by means of the induction magnetic anisotropy or the configuration anisotropy during the forming of the magnetoresistance effect film (magnetic film). Therefore, after the magnetic film is formed or after the patterning process, it is difficult to vary the anisotropic magnetic field of the magnetic film.

On the other hand, in the magnetic field sensor of the invention, since the thin-film elements are formed on the flexible substrate as aforementioned, the substrate can be easily deformed. As a result, a stress can be optionally applied from the outside to the magnetic film on the substrate. Further, by changing the magnitude of deformation or the direction of deformation (forming the substrate in a convex or concave configuration), the magnitude of the stress and the direction of compressive or tensile stress can be optionally changed. Concrete constitutional examples are shown in FIGS. 7 to 9.

Figure 7:
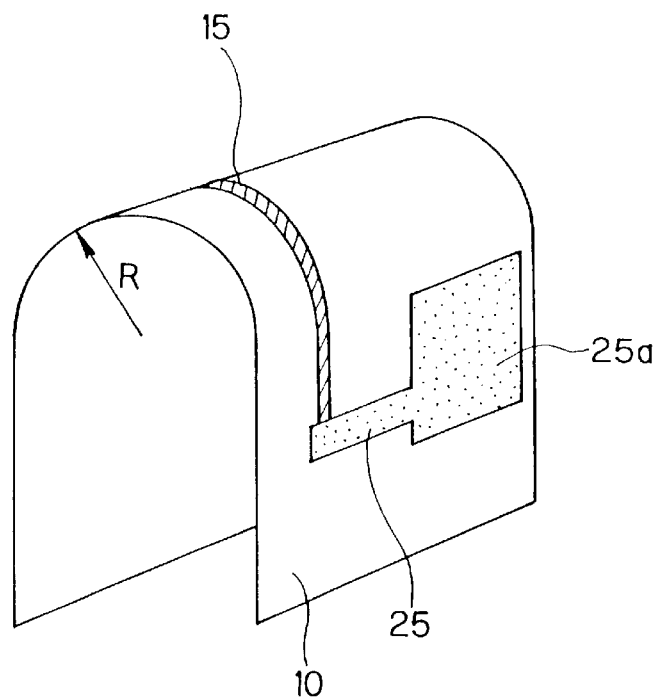
FIG. 7 is a perspective view showing a curved portion (convex configuration) with a curvature radius R which is formed by curving the planar magnetic field sensor shown in FIG. 3 in such a manner that a line Z–Z' becomes a top of the curved portion.

FIG. 7 is a perspective view of a curved portion (convex configuration) with a curvature radius R which is obtained by curving the planar magnetic field sensor shown in FIG. 3 in such a manner that a line Z–Z' becomes a top of the curved portion. As clearly seen from FIG. 7, the magnetic film 15 is also curved along the curved portion with the curvature radius R. As a result, a stress is applied into the magnetic film 15. By arbitrarily changing the degree of the stress, i.e. the value of the curvature radius R, the magnetic property of the magnetic film 15 can be selected arbitrarily. This means that even in case of the same element by changing the stress applied from the outside to the curved magnetic film 15, the detected saturation magnetic field can be changed. A resistance change ratio $\Delta\rho$ of the magnetic body due to the magnetic field is substantially determined by structure, material or the like. Therefore, by setting the saturation magnetic field in accordance with a magnetic field intensity H to be detected, a larger magneto-sensitivity Δρ/H can be obtained. Further in the magnetic field sensor having a small saturation magnetic field against the external magnetic field, when a change (especially, decrease) in external magnetic field occurs as a small positional change rapidly in a pulse manner only for a short time, then a pattern area of the magnetoresistance effect film does not form a point, but has a finite area. In many cases only the pulse-like minimum magnetic field portion fails to be detected. Further, an output of an element is lowered.

In the magnetic field sensor of the invention, since the curved portion can be formed as aforementioned, by making changes according to product specifications only in the final stage of the manufacture process (e.g. changing the size of the curved portion), the element can be easily manufactured in accordance with the magnetic field intensity to be detected.

Figure 8:
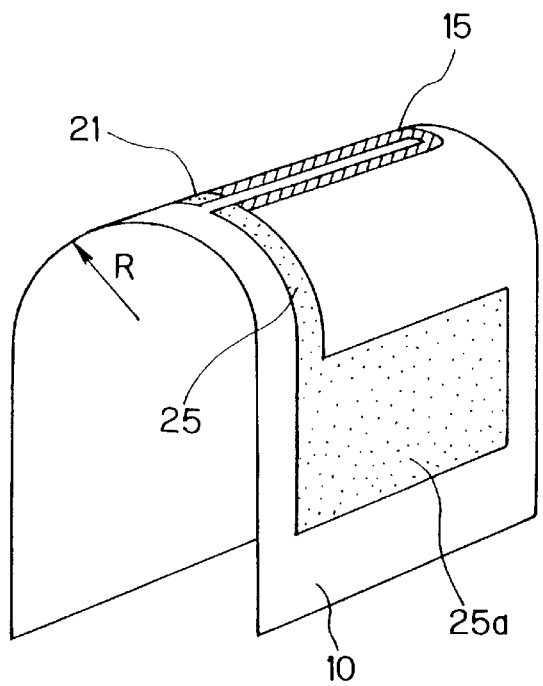
FIG. 8 is a perspective view showing a curved portion (convex configuration) with a curvature radius R which is formed by curving the planar magnetic field sensor shown in FIG. 4 in such a manner that a line Z–Z' becomes a top of the curved portion.
Figure 9:
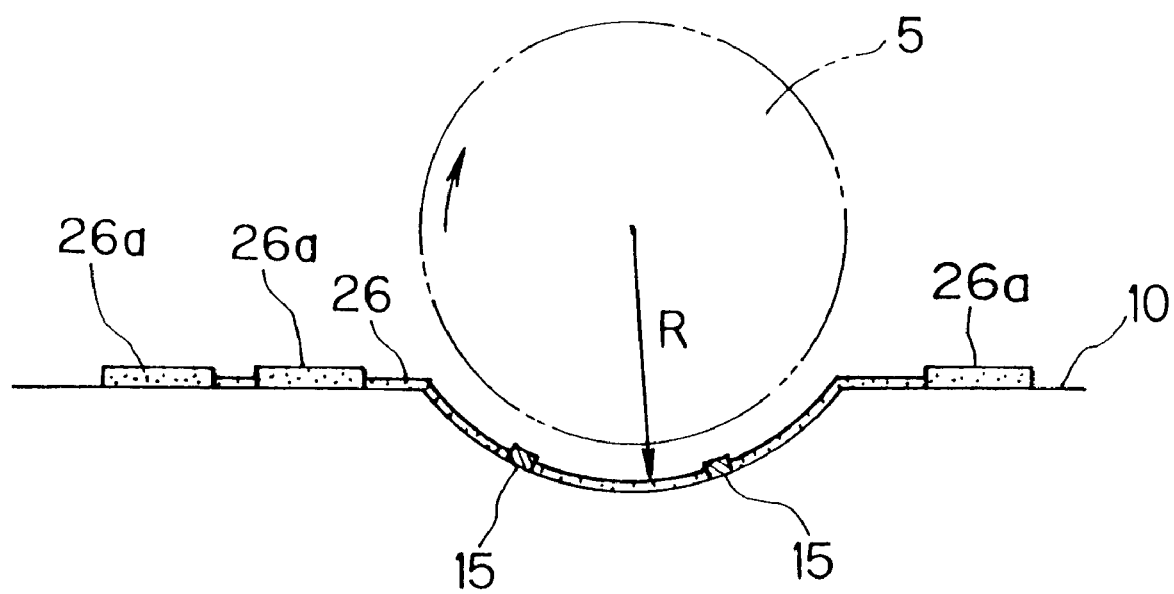
FIG. 9 is a sectional view showing a curved portion (concave configuration) with a curvature radius R which is formed by curving the planar magnetic field sensor shown in FIG. 6 in such a manner that a line Z–Z' becomes a bottom of the curved portion.

Additionally, FIG. 8 is a perspective view of a curved portion (convex configuration) with a curvature radius R which is obtained by curving the planar magnetic field sensor shown in FIG. 4 in such a manner that a line Z–Z' becomes a top of the curved portion. The magnetic film 15 is also curved along the curved portion with the curvature radius R. As a result, a stress is applied into the magnetic film 15. FIG. 9 is a sectional view showing a curved portion (concave configuration) with a curvature radius R which is formed by curving the planar magnetic field sensor shown in FIG. 6 in such a manner that a line Z–Z' becomes a bottom of the curved portion. The magnetic films 15 are also curved along the curved portion with the curvature radius R. As a result, a stress is applied into the magnetic films 15. FIG. 9 illustrates a so-called differential operation type of magnetic field sensor provided with two magnetic films 15, i.e. a rotation detecting sensor for detecting the rotation frequency of a rotor 5.

In the differential operation type of magnetic field sensor provided with two or more magnetic films 15, pitches among plural magnetic field detecting portions need to be optimized. For example, when a pitch of magnetic field occurrence in a detected body of a magnetic gear structure is set as P, the pitch between the magnetic field detecting portions of the detecting element becomes P/2 or P/4. Therefore, when the pitch in the magnetic field generating portion to be detected is varied, elements having various specifications need to be prepared in accordance with the variation. For example, when a 48 pole magnetic gear is used as the magnetic field generating portion, the rotation sensor usually has various gear diameters such as 50, 67, 70, 89 and 96 mm. In contrast, in the magnetic field sensor of the invention, because the element itself can be easily bent, only the pitch between the magnetic field detecting elements needs to be changed. The state is now described with reference to FIGS. 10A to 10D.

Figure 10A:
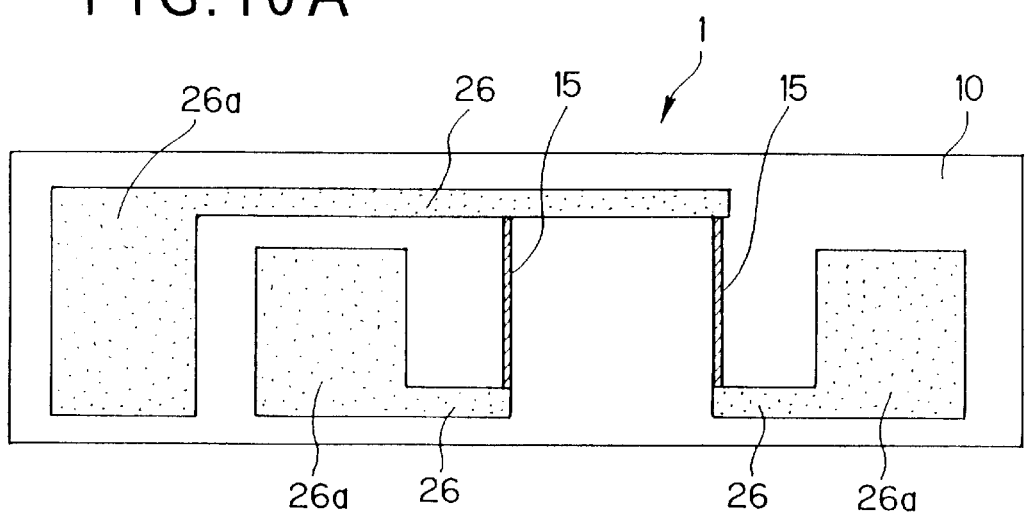
FIG. 10A is a plan view of a magnetic field sensor (differential operation type) according to the invention.
Figure 10B:
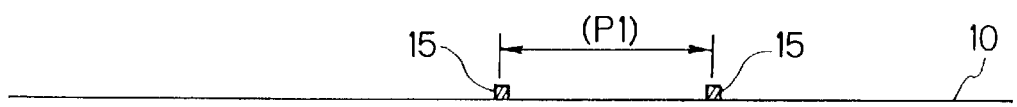
FIG. 10B is a sectional view of FIG. 10A and FIGS. 10C and 10D are sectional views showing deformed elements.
Figure 10C:
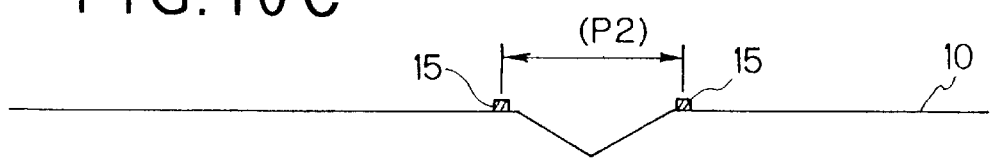
Figure 10D:
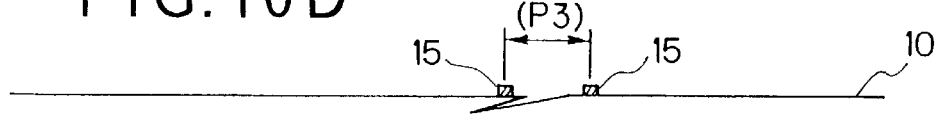

FIG. 10A is a plan view of the magnetic field sensor (differential operation type) according to the invention and corresponds to FIG.6. FIG. 10B is a sectional view of FIG. 10A, from which to facilitate the understanding of the invention the conductive electrode films are omitted. As shown in FIGS. 10A and 10B. when the element is not deformed, a pitch between two magnetic films 15 is set to be P1. The pitch P1 can be easily changed. Specifically, as shown in FIGS. 10 C and 10D, by curving or folding the flexible substrate 10 between the two magnetic-field detecting magnetic films 15, the pitch between the magnetic field detecting portions can be changed, for example, to P2 or P3. In this case, the flexible substrate can be bent in such a manner that a folded portion becomes concave or convex. Further, by increasing folded portions, even when the folded portion in a central portion is concave, the middle between the central portion and the magnetic field detecting portions (magnetic film 15) is further folded in a convex manner, so that the magnetic field detecting portions can be positioned close to the magnetic field generating portion. Also, by folding portions other than the magnetic field detecting portions, the pitch between the magnetic field detecting portions can be reduced.

Thus, in the magnetic field sensor of the invention, the element itself can be easily bent. Therefore, the pitch between the magnetic field detecting portions can be changed. Only by making changes according to the product specifications in the final manufacture stage (e.g. changing a degree of bending or folding), the element can be easily manufactured in accordance with a detected object.

Concrete examples of the invention are now described.

EXAMPLE I

Polyimide films, Upyrex (three types of thickness 12.5 μm, 75 μm and 125 μm) manufactured by Ube Kosan Kabushiki Kaisha were prepared. These films were used as flexible substrates according to the invention. Also, as a comparative example, a 0.7 mm thick glass substrate with a diameter of three inches was used as a comparative substrate. On each of the substrates, by an ion beam sputtering device, a GMR effect film (magnetic film 15) was formed as shown in Table I-1. Table I-1 shows a multilayered film structure with respect to thickness and composition of films in order of forming. Although not shown in Table I-1, for example, 50 Å–Ta/( 10 Å–NiFe/ 5 Å–Cu)×10 indicates a magnetic multilayered film constituted of twenty one layers having a total thickness of 200 Å in which a first layer of Ta with 50 Å, then ten layers of NiFe alloy with 10 Å and ten layers of Cu with 5 Å are laminated in sequence.

TABLE I-1

| FILM STRUCTURE OF MAGNETORESISTANCE EFFECT FILM |
| --- |
| Film A: 50Å-Ti/50Å-NiFe/(22Å-Cu/15Å-NiFe) × 30/50Å-Cu |
| Film B: 100Å-Ag/50Å-CoNiFe/(22Å-Cu/15Å-CoNiFe) × 30/50Å-Cu |
| Film C: 50Å-Cr/(35Å-Cu/10Å-Co/35Å-Cu/10Å-NiFe) × 10/50Å-Cu |
| Film D: 100Å-Ti/50Å-NiFe/20Å-Cu/30Å-NiFe/100Å-FeMn/50Å-Cu |

For targets used when forming the GMR effect film, a target composition had a purity of 99.9% or more, and an ultimate pressure was $4 \times 10^{-7}$ Torr. After evacuation to obtain the ultimate pressure, argon gas was introduced to obtain a vacuum degree of $1.4 \times 10^{-4}$ Torr during the film forming. Additionally, only the induction ferri-multilayered film with the film structure C shown in Table I-1 was formed by an extra-high vacuum evaporation device. When forming either film, a substrate was water-cooled. After the GMR effect multilayered film was formed all over the substrate, a photoresist was exposed through a mask to develop an image. Subsequently, after a desired magnetic film pattern was formed, an unnecessary portion was removed by an ion milling device. Thereafter, the portion other than a conductive electrode film (but including the magnetic film pattern to form the magnetic field detecting portion) was covered with a polyimide resist, and a copper film with a thickness of 3 μm was formed as the conductive electrode film was formed by an electric plating process. On the copper film, an electroless nickel plating was formed to be a 0.2 μm thick film, on which an electroless gold plating was further formed to be a 0.5 μm thick film. After plating, thermal treatment was performed at 300° C. for one hour in vacuum to cure the polyimide resist. Finally, individually separated magnetic field sensors were obtained.

To an external connection portion (electrode pad portion) at an end of the conductive electrode film in each magnetic field sensor, a tin-plated copper wire was soldered and bonded. The connecting portion was about 1 mm thick from a substrate surface. Further, when the tin-plated copper wire was drawn, the copper wire was in some case apart by about 3 mm at maximum from the substrate surface.

The magnetic field sensors with the conductive electrode films formed thereon were placed on various auxiliary members (Teflon) to form various deformed element samples as shown in following Table I-2.

TABLE I-2

CONFIGURATIONS OF MAGNETORESISTANCE
EFFECT ELEMENTS AND TYPES OF USED FILMS

|  | Substrate (Thickness: μm) | MR Effect Film Type | Element Configuration |
|---|---|---|---|
| Example I-1 | Polyimide (12.5) | Film A | As Shown in FIG. 2 |
| Example I-2 | Polyimide (75) | Film B | As Shown in FIG. 2 |
| Example I-3 | Polyimide (125) | Film C | As Shown in FIG. 5 |
| Example I-4 | Polyimide (75) | Film C | As Shown in FIG. 8 |
| Example I-5 | Polyimide (125) | Film D | As Shown in FIG. 2 |
| Compar. I-1 | Glass | Film A | Not Deformed (Plane) |

A change in voltage of each of these element samples having the above configurations was measured by applying a current of 5 to 50 mA at positions 1 mm, 3 mm and 4 mm distant from a 48-pole magnetic gear with a diameter of 96 mm. Measurement results are shown in Table I-3.

TABLE I-3

MEASUREMENT CONDITIONS AND VOLTAGE CHANGE

|  | Distance From Gear (mm) | Output (mV) |
|---|---|---|
| Example I-1 | 1 mm | 100 |
|  | 3 mm | 10 |
| Example I-2 | 1 mm | 150 |
|  | 3 mm | 25 |
| Example I-3 | 1 mm | 40 |
|  | 3 mm | 70 |
| Example I-4 | 1 mm | 70 |
|  | 3 mm | 30 |
| Example I-5 | 1 mm | 20 |
|  | 3 mm | 20 |
| Compar. I-1 | 1 mm | * |
|  | 3 mm | * |
|  | 4 mm | 3 |

*: Cannot be measured because of contact

The above results clearly show the effect of the invention. Specifically, in the magnetic field sensor of the invention, since the magnetic film having the magnetoresistance effect for detecting the magnetic field and the conductive electrode film for applying a current to the magnetic film are deposited on the flexible substrate, the element itself can be deformed. Therefore, on the surface with the magnetic-field detecting magnetic film formed thereon, there is no protruded portion (concave portion) which inhibits magnetic field detection.

Further, a magnetic field sensor superior in weatherability can be easily manufactured in a simple process. Also, by applying an appropriate stress to the magnetic film on the flexible substrate while deforming the substrate, its magnetic elasticity effect can be used to easily optimize the magnetic property in accordance with product specifications. Additionally, in the differential operating magnetic field sensor in which at least two magnetic films are disposed with the predetermined interval therebetween, by arbitrarily changing the interval between the magnetic films, an optimum measurement specification can be set.

(2) Second Aspect of the Invention

In the second aspect of the invention, there is provided a magnetic field sensor 2 which has plural magneto-sensitive pattern portions for detecting a magnetic field. At least one magneto-sensitive pattern portion and the other magneto-sensitive pattern portions are arranged in an opposed positional relationship on different planes. Here, to facilitate the understanding of the invention, an embodiment provided with two opposed magneto-sensitive pattern portions is now described.

Figure 11A:
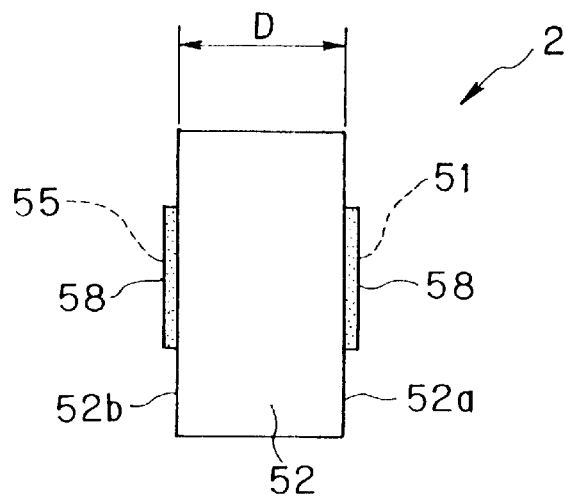
FIG. 11A is a front view of a magnetic field sensor.
Figure 11B:
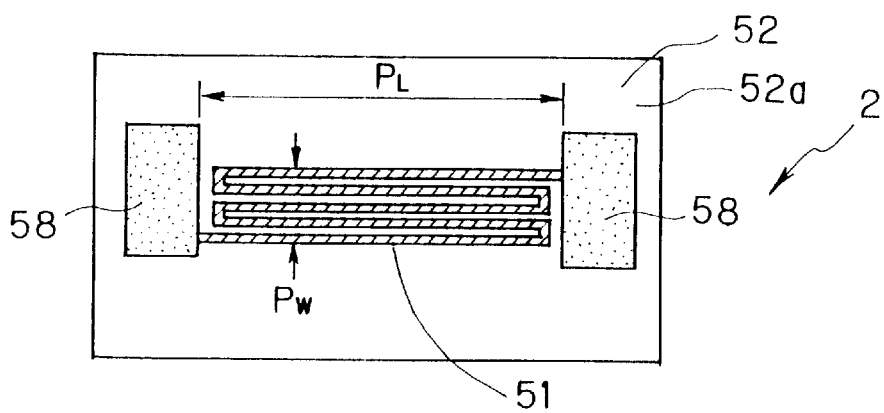
FIG. 11B is a right-side view of FIG. 11A
Figure 11C:
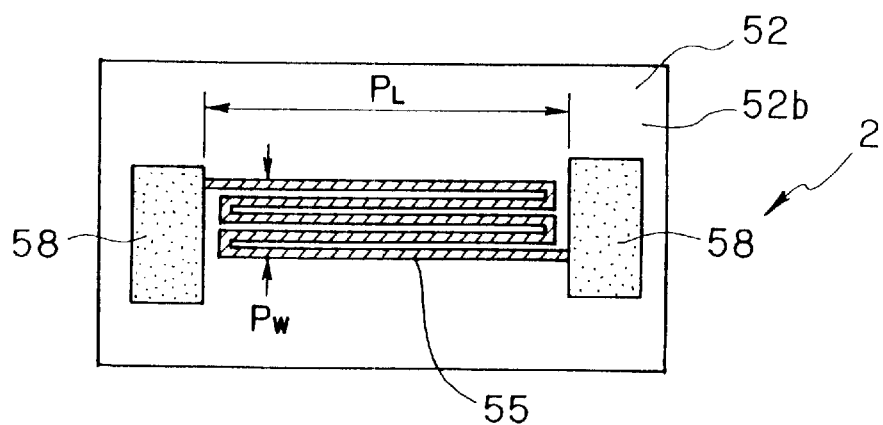
FIG. 11C is a left-side view of FIG. 11A.

FIGS. 11A to 11C show a most basic constitution of the magnetic field sensor 2 according to the invention. FIG. 11A is a front view of the magnetic field sensor 2. FIG. 11B is a right-side view of FIG. 11A and FIG. 11C is a left-side view of FIG. 11A.

As shown in the drawings, the magnetic field sensor 2 has a first magneto-sensitive pattern portion 51 and a second magneto-sensitive pattern portion 55. These magneto-sensitive pattern portions 51 and 55 are arranged in an opposed positional relationship on different planes. Specifically, in FIG. 11A, the first magneto-sensitive pattern portion 51 is formed on a side face 52a of a substrate 52 which has two substantially parallel faces 52a and 52b, while the second magneto-sensitive pattern portion 55 is formed on the other side face 52b. Here, "the opposed positional relationship" indicates that the first magneto-sensitive pattern portion 51 and the second magneto-sensitive pattern portion 55 are opposed substantially parallel to each other so as to detect magnetic fields without departing from the scope of the invention. Herein, the term "opposed" is broad in concept indicating that the substrate 52 is interposed as clearly seen from FIG. 11A.

As shown in FIGS. 11B and 11C, each of the first and second magneto-sensitive pattern portions 51, 55 is constituted by folding a line pattern plural times. Further, on both ends of the first or second magneto-sensitive pattern portion 51, 55, electrode pads 58 are formed to apply a current. Additionally, the material of the magneto-sensitive pattern portions 51 and 55 can be the same as that of the electrode pad 58. Specifically, the electrode pad 58 can be formed of a magneto-sensitive material.

A distance D between the first and second magneto-sensitive pattern portions 51 and 55 which are disposed in the opposed positional relationship (FIG. 11A) is a length of $\lambda/4$ or $\lambda/2$, in which $\lambda$ is a magnetic-field pitch of a detected body. This is later detailed.

Figure 12:
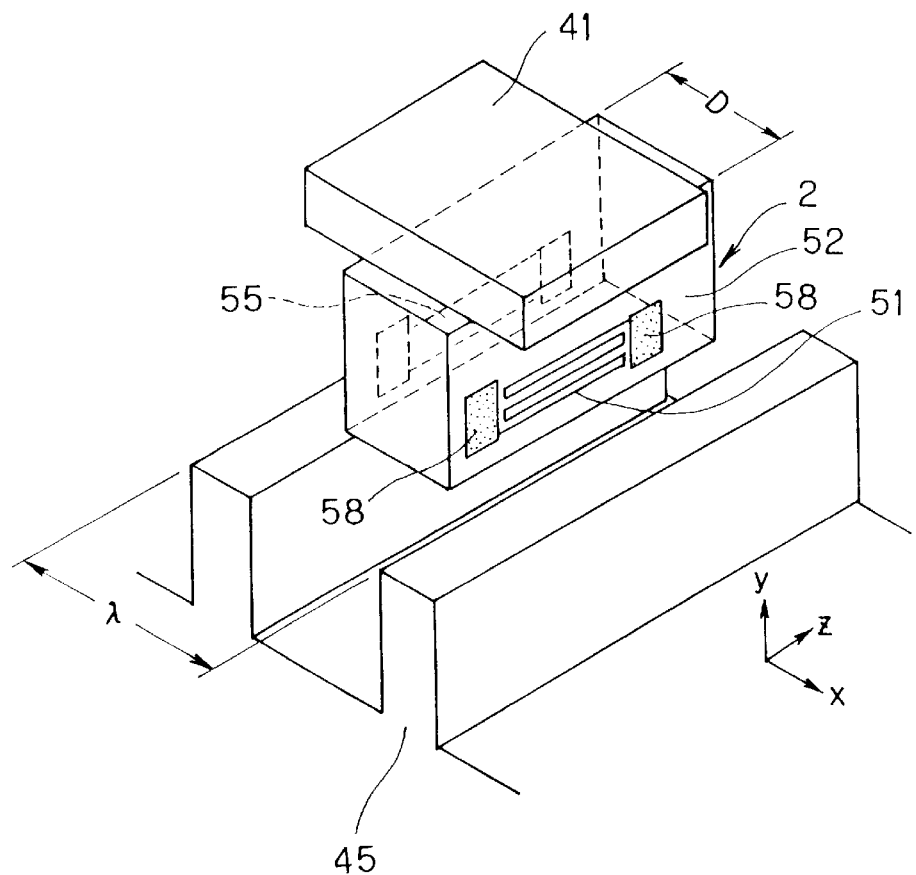
FIG. 12 is a perspective view showing an example of operation of a magnetic field sensor according to the invention.

FIG. 12 shows an example of operation of the magnetic field sensor 2 according to the invention shown in FIGS. 11A–11C. In FIG. 12, the magnetic field sensor 2 is mounted with a slight clearance (so-called air gap) over a rotary gear 45 (detected body) which is constituted of, for example, a soft magnetic body. With a predetermined interval from the magnetic field sensor 2, a permanent magnet 41 is mounted. A magnetic flux from the permanent magnet 41 changes in accordance with a positional relationship of the rotary gear 45 formed of the soft magnetic body, i.e., a positional relationship with irregular portions as teeth formed on a periphery of the rotary gear 45. The condition of the change is detected by the magneto-sensitive pattern portions 51 and 55 which are formed with the predetermined interval D therebetween. In FIG. 12. for a directional relationship among x, y and z in a three-dimensional space, a rotating direction of the rotary gear 45 is indicated as an x-axis direction, an upper direction of the rotary gear 45 as a y-axis direction and a width direction of the rotary gear 45 as a z-axis direction.

Figure 16:
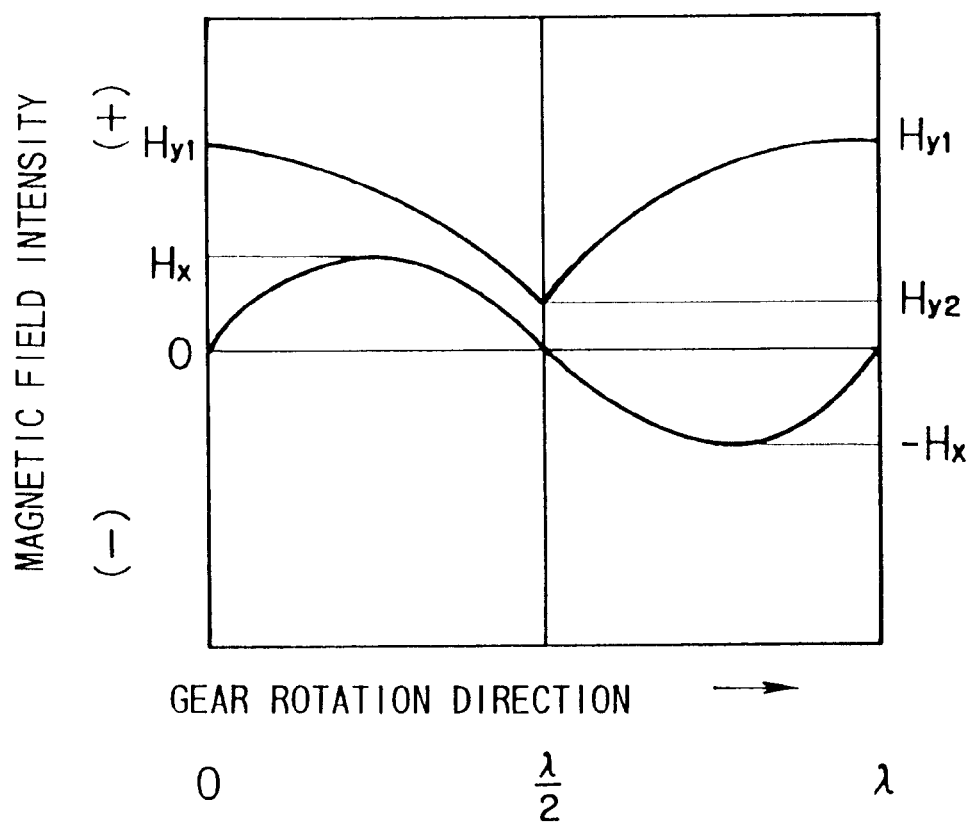
FIG. 16 is a graph showing a magnetic field change with rotation of a rotary gear.

In the embodiment shown in FIG. 12, the magnetic flux from the permanent magnet 41 changes with its positional relationship with the rotary gear 45. A gear pitch of the rotary gear 45 is $\lambda$, the same as the pitch $\lambda$ of the magnetic field to be detected. A recess and a protrusion forming each tooth of the gear take $\lambda/2$, respectively. However, the gear pitch is not restricted. For example, the protrusion can take $\lambda/3$, while the recess takes $2\lambda/3$. As aforementioned, when the rotating direction of the gear 45 is set as the x-axis and the upper direction thereof is the y-axis, then the magnetic field right under the magnet 41 changes with rotation of the rotary gear 45 as shown in FIG. 16. Specifically, as the gear rotates, an x-direction magnetic-field intensity changes from zero, a maximum magnetic field intensity Hx, then zero, a maximum magnetic field intensity $-Hx$ in an opposite direction, to zero again during one cycle $\lambda$ of the gear. In contrast, a y-direction magnetic-field intensity decreases from a maximum magnetic field intensity Hy1 to a minimum magnetic field intensity Hy2 during $\lambda/2$ and changes to the maximum magnetic field intensity Hy1 during another $\lambda/2$. Specifically, to effectively detect magnetic fields in a differential operation, two magneto-sensitive pattern portions 51 and 55 may be disposed with the interval $\lambda/4$ for detection in the x-axis direction and the interval $\lambda/2$ for detection in the y-axis detection. Therefore, for the detection in the x-axis direction, $D=\lambda/4$, while for the detection in the y-axis direction, $D=\lambda/2$. It can be seen that in either case the smaller x-direction widths of the magneto-sensitive pattern portions 51 and 55 are, the more efficiently a differential output can be obtained.

Figure 24:
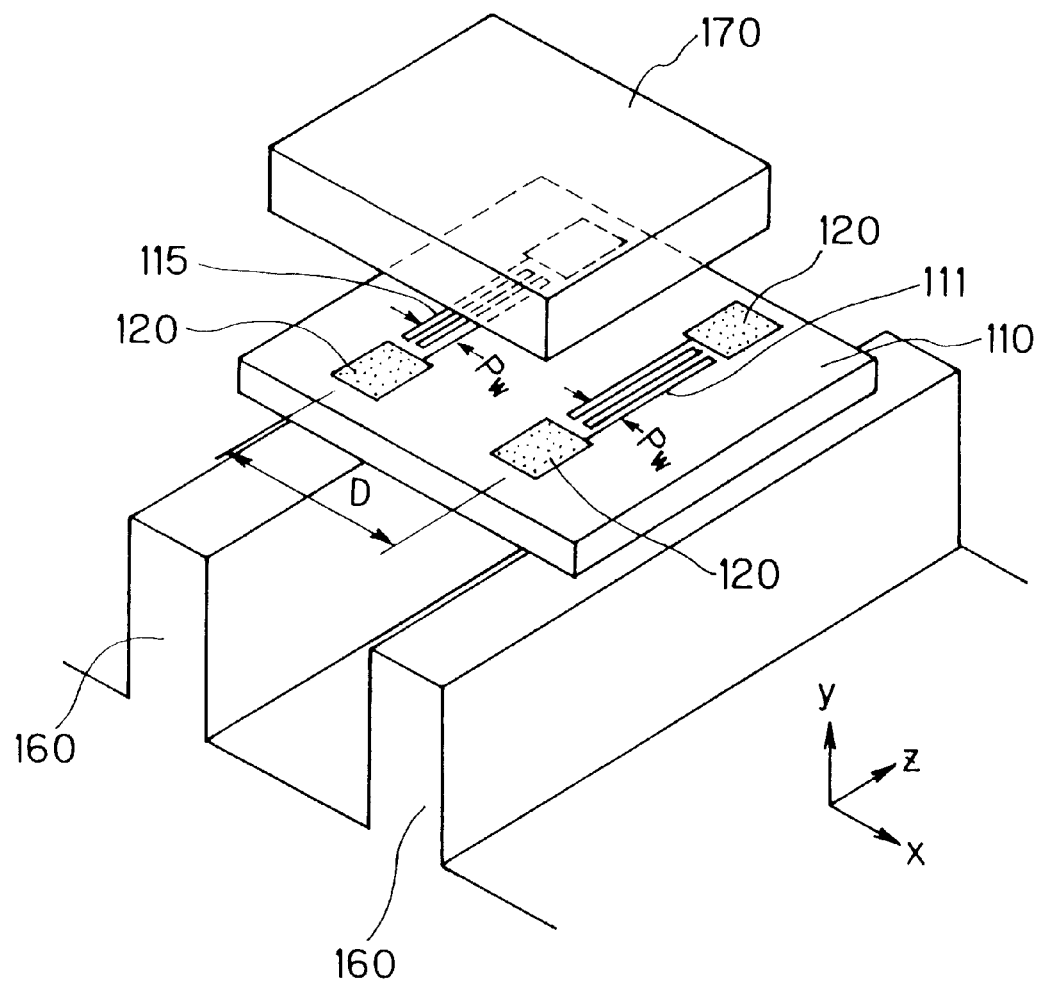
FIG. 24 is a perspective view showing an operation example of a prior-art magnetic field sensor.
Figure 25:
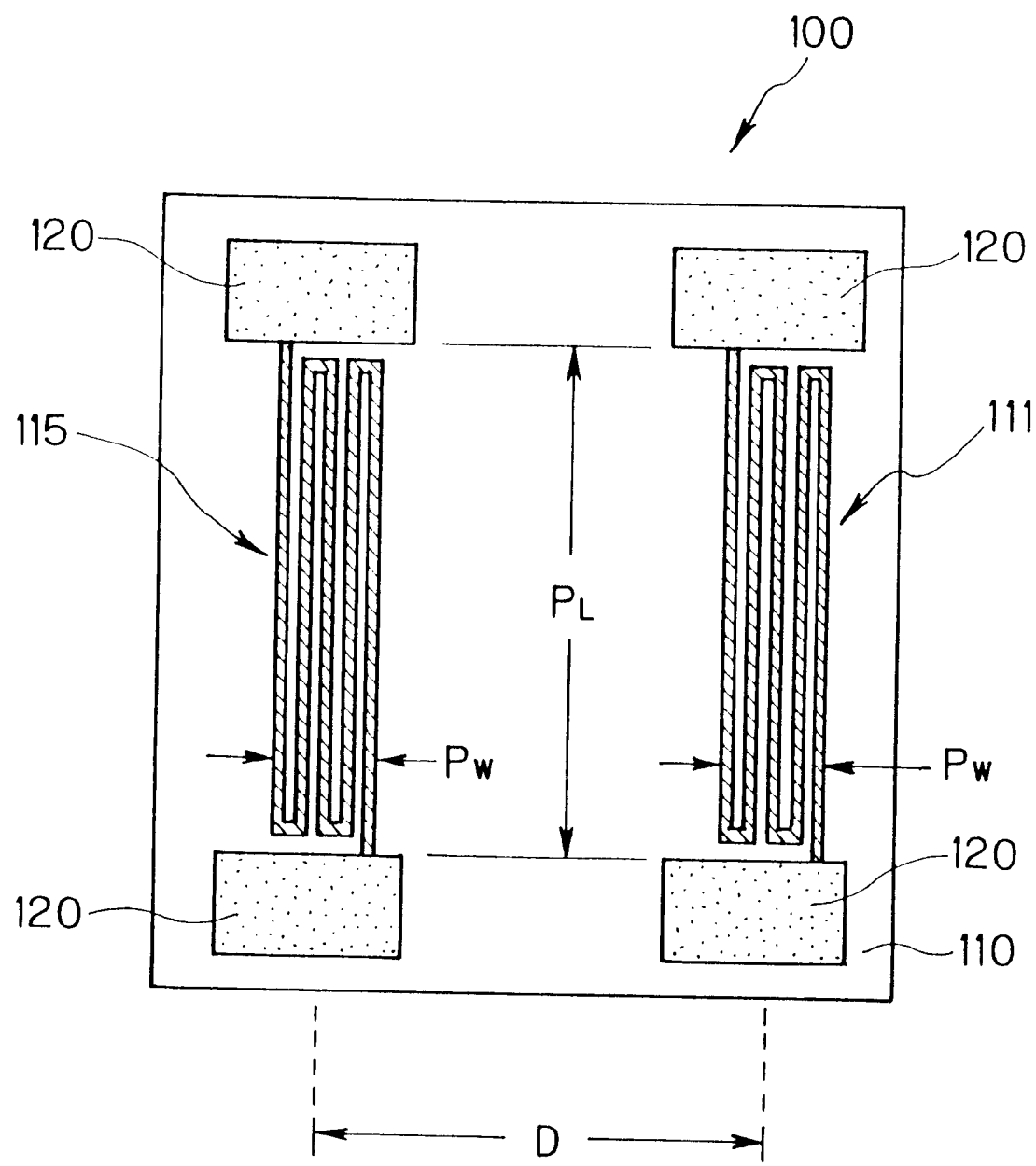
FIG. 25 shows an arrangement of magneto-sensitive pattern portions in the prior-art magnetic field sensor.
Figure 26:
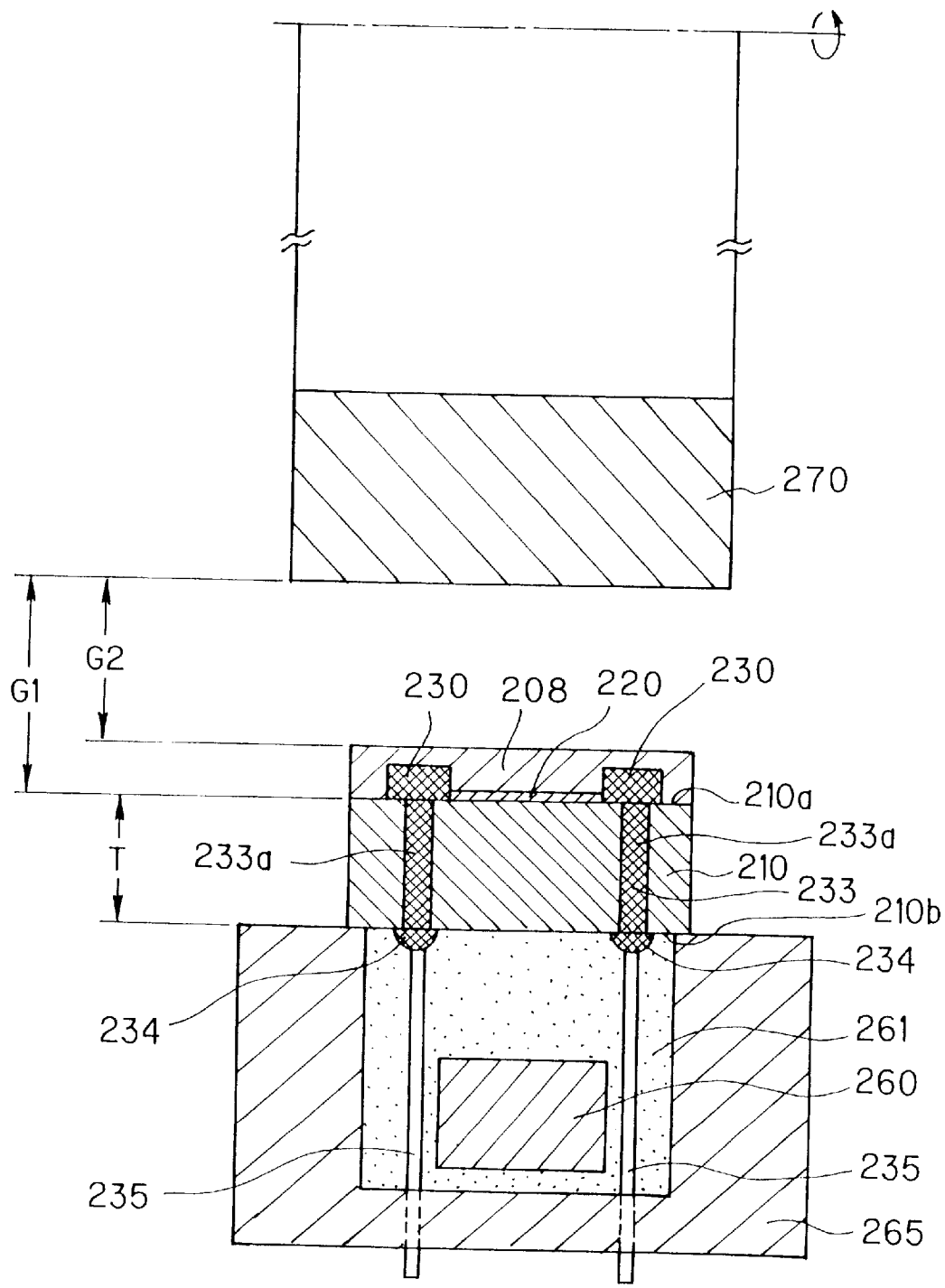
FIG. 26 is a sectional view showing an operation mode of the prior-art magnetic field sensor.

In the invention, as shown in FIG. 12, the x-direction width of the magneto-sensitive pattern portion 51 or 55 is a film thickness of 1 $\mu$m or less at a maximum. On the other hand, in the known conventional constitution shown in FIGS. 24 and 25, the pattern line width Pw corresponds to the x-direction width. The value of Pw is obtained by adding a spatial width to a value of (a line width of magneto-sensitive pattern portion)×(folding times), e.g. several tens to 100 $\mu$m or more.

The magnetic field sensor 2 as shown in FIGS. 11A–C and 12 is obtained by preparing the substrate 52 with a thickness D and forming the thin-film magneto-sensitive pattern portions 51 and 55 on both faces in a thickness direction, respectively. The embodiment is the simplest method for firmly regulating the interval D between the magneto-sensitive pattern portions, but the method is restrictive. Further, embodiments shown in FIGS. 13 to 15 are available.

Figure 13:
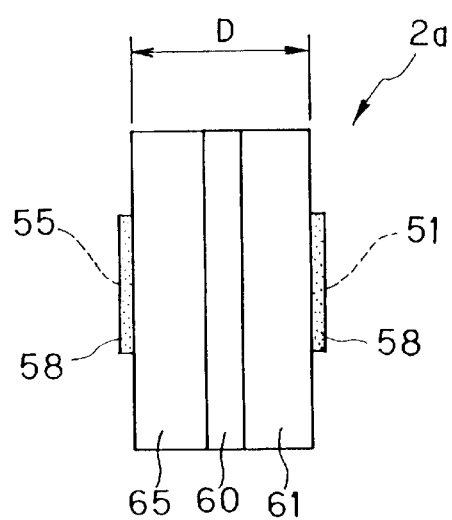
FIG. 13 is a front view showing a preferred embodiment of the magnetic field sensor according to the invention (corresponding to FIG. 11A)

A magnetic field sensor 2a shown in FIG. 13 is provided with a first substrate 61 with the first magneto-sensitive pattern portion 51 formed thereon, a second substrate 65 with the second magneto-sensitive pattern portion 55 formed thereon and a spacer 60 for adjusting the interval between the first and second magneto-sensitive pattern portions 51 and 55. The first substrate 61 and the second substrate 65 are integrally formed via the spacer 60. In this embodiment, just by changing a thickness of the interposed spacer, the magnetic field sensor can be easily adapted to various specifications of $\lambda$ value of the detected body. The spacer 60 is usually constituted of a nonmagnetic material. By intentionally using a soft magnetic body, a shield effect can be provided.

Figure 14:
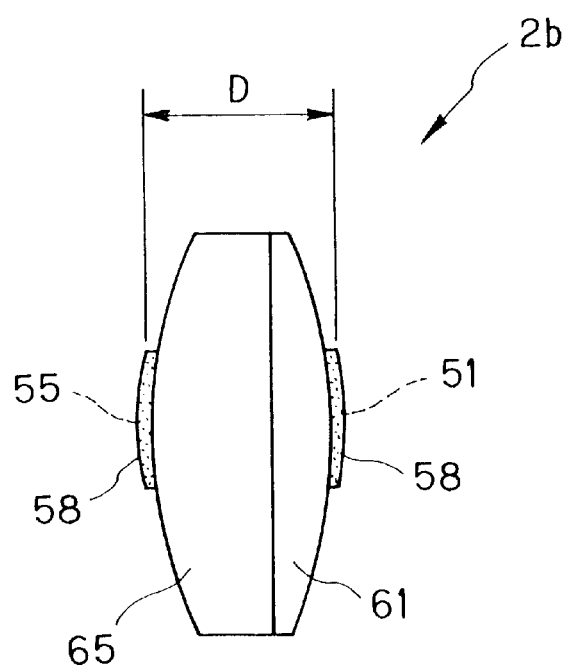
FIG. 14 is a front view showing another preferred embodiment of the magnetic field sensor according to the invention (corresponding to FIG. 11A)

A magnetic field sensor 2b shown in FIG. 14 is provided with the first substrate 61 with the first magneto-sensitive pattern portion 51 formed thereon and the second substrate 65 with the second magneto-sensitive pattern portion 55 formed thereon. The first substrate 61 and the second substrate 65 are integrally formed. In the embodiment, first various substrates with different thicknesses are prepared, and two of them are appropriately combined to be easily adapted to various specifications of $\lambda$ value. Alternatively, surfaces of the substrates 61 and 65 with the magneto-sensitive pattern portions 51 and 55 formed thereon can be curved without departing from the operational effect of the invention. In the curved faces, especially a stress can act on the films. With the magnetic elasticity effect anisotropy produced by the stress, the magnetic sensitivity can be adjusted.

Figure 15:
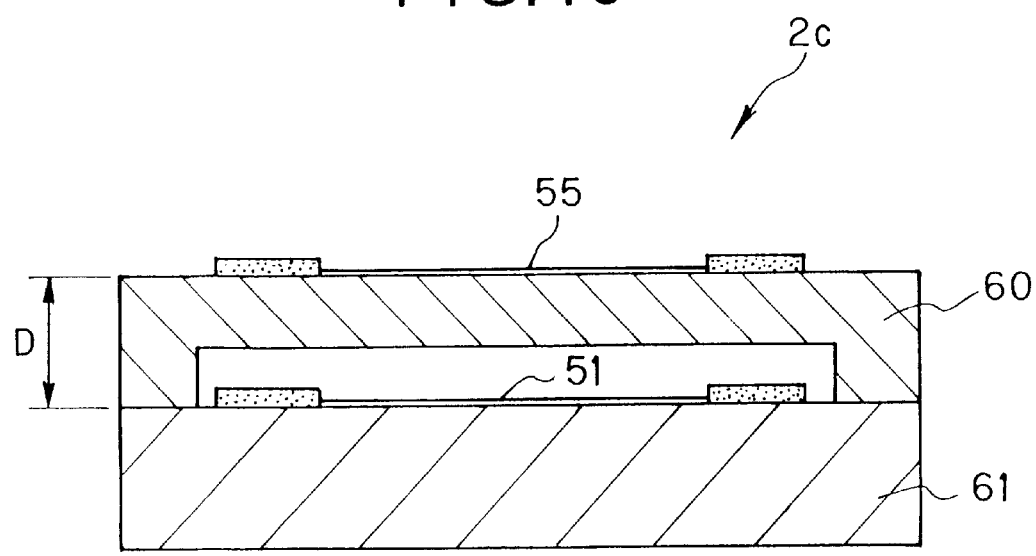
FIG. 15 is a schematic sectional view showing further preferred embodiment of the magnetic field sensor according to the invention.

A magnetic field sensor 2c shown in FIG. 15 is provided with the first substrate 61 with the first magneto-sensitive pattern portion 51 formed thereon and the spacer 60 mounted on the first magneto-sensitive pattern portion 51. On the spacer 60 the second magneto-sensitive pattern portion 55 is formed. Especially because the elements are formed on only one face of one substrate, this embodiment is compatible with a general thin-film forming process.

It is known that the distance D between the magneto-sensitive pattern portions 51 and 55 effective for differential detection may be set to $\lambda/4$ or $\lambda/2$, in which $\lambda$ is a detected pitch (magnetic-field pitch) of the detected body (e.g., the rotary gear 45). Specifically, when the detected pitch $\lambda$ is 8 mm, the aforementioned value D is usually set to 4000 or 2000 $\mu$m. For the usual magneto-sensitive pattern portion 51 or 55, its pattern line width Pw is 5 to 100 $\mu$m and its pattern line length PL (FIGS. 11B–C) is 100 to 500 $\mu$m. Also, a size of the electrode pad 58 is usually 5 to 500 $\mu$m square. Therefore, considering the area occupied by one magneto-sensitive pattern portion and the electrode pads disposed on both ends thereof, a maximum widthwise size is usually determined by the size of the electrode pads to be 5 to 500 $\mu$m. Also, when considering the area occupied by one magnetic field sensor provided with a pair of magneto-sensitive pattern portions, the distance D is as long as 4000 or 1000 $\mu$m. Therefore, in the prior-art arrangement shown in FIG. 25, the area required by one magnetic field sensor (the area including the substrate) is large.

On the other hand, in the magnetic field sensor according to the invention, as shown in FIGS. 11A to 11C, the interval D on the same plane does not need to be considered. The necessary area for one magnetic field sensor (the area including the substrate) can be remarkably reduced. Therefore, since the number of magnetic field sensors manufactured from one wafer is large, the cost can be remarkably reduced.

Also, when the distance D between the magneto-sensitive pattern portions 51 and 55 is excessively reduced, in the constitution of the invention, the thickness of the substrate 52 can only be decreased to precisely obtain a desired D value. For example, for the requirement of D=10 $\mu$m, the magneto-sensitive pattern portions 51 and 55 may be formed on both faces of a 10 $\mu$m thick polyimide film.

According to the invention, the magneto-sensitive pattern portions 51 and 55 are as aforementioned formed on different planes, which are preferably substantially parallel. However, in some operation mode of the magnetic field sensor, by applying a stress from the outside to the magneto-sensitive pattern portions formed on the polyimide film, the magneto-sensitive pattern portions including the film are curved, in order that the magnetic sensitivity is controlled by the magnetic elasticity effect. In this case, the respective faces with the magneto-sensitive pattern portions 51 and 55 formed thereon cannot be completely parallel, but may be almost parallel without departing from the effect of the invention.

The magneto-sensitive pattern portions 51 and 55 which can be used in the invention are films having a magnetoresistance effect, and may have either a single-layer film structure or a multilayered film structure. The magnetoresistance effect means the phenomenon in which the electric resistance changes with a magnetic field change. There is no problem if the magneto-sensitive pattern portions 51 and 55 are of ferromagnetic films which exhibit an anisotropic magnetoresistance effect (anisotropic magnetoresistance effect films). Especially preferable is a GMR effect film which has a high detecting sensitivity and can largely vary the magnetic field intensity.

As introduced in Metal Artificial Lattice (Hiroyasu FUJIMORI, AGNE Technical Center, published in 1995), page 347, the GMR effect film is a multilayered film constituted of ferromagnetic films and nonmagnetic films. It is known that a change in interface diffusion in the multi-layered film causes a change in resistance.

The GMR effect film is largely classified into ① an antiferromagnetic-coupled type having a ferromagnetic body/nonmagnetic conductor structure, ② an induction ferri (non-coupled) type having a high coercive-force ferromagnetic body/nonmagnetic conductor/low coercive-force ferromagnetic body structure, ③ a spin valve type having a semi-ferromagnetic body/ferromagnetic body/ non-magnetic conductor/ferromagnetic body structure and ④ a Co/Ag non-solid solution system granular type.

These GMR effect films are largely different from one another in magnetic field intensity to be detected, i.e. the saturation magnetic field intensity of the magnetoresistance effect, because of their structures and compositions. For example, an Fe/Cr system antiferro type can detect a magnetic field of 10 KOe or more, a CoNiFe/Cu system antiferro type 0.10 e to 1 KOe, an NiFe/Cu/Co/Cu system induction ferri type about 50 e to 200 e, an FeMn/NiFe/Cu/NiFe system spin valve type several 0 e, and a granular type about 1000 e to 5 KOe. The magnetic sensitivity is obtained by dividing the maximum MR change ratio by the saturation magnetic-field intensity. Even when the maximum MR change ratio is large, the magnetic sensitivity is deteriorated if the saturation magnetic field is large. Conversely, even when the maximum MR change ratio is small, the magnetic sensitivity is good if the saturation magnetic field is very small. Therefore, to obtain an optimum magnetic sensitivity in accordance with the magnetic-field intensity to be detected, from the aforementioned various GMR effect films, a basic system is first selected. Then, its composition system is changed or its fine structure is optimized for use. Especially, different from the anisotropic magnetoresistance effect film, the GMR effect film has its resistance changing isotropically for the in-plane magnetic field. Also for these reasons, the GMR effect film is especially preferable for use.

The magnetoresistance effect film (the magneto-sensitive pattern portions 51, 55) is formed by a vacuum film-forming process such as evaporation, sputtering or the like. Specifically, after the magnetoresistance effect film is formed all over the substrate 52, the film is patterned into a desired pattern to form the magneto-sensitive pattern portion 51 for detecting magnetic fields. Further, the electrode pads (conductive electrode films) 58 are formed in predetermined patterns to be connected to the magneto-sensitive pattern portion 51 for applying a current thereto. It is important that the electrode pads 58 have a smaller resistance than the magneto-sensitive pattern portion as the magnetoresistance effect film. For this, each of the electrode pads 58 is formed to have a rather large thickness of, for example, 0.3 to 5.0 $\mu$m by using a highly conductive metal, for example, copper, gold, aluminum or the like. To form the electrode pads, in addition to the vacuum film-forming process, a wet film-forming process can be used. Alternatively, after the electrode pads 58 are formed, the magneto-sensitive pattern portion (the magnetoresistance effect film) can be formed. As aforementioned, the magneto-sensitive pattern portions 51 and 55 and the electrode pads 58 are individually constituted of different materials. Alternatively, these can be integrally formed (into a film) of the same material. However, in this case, the magneto-sensitive pattern portions 51, 55 and the electrode pads 58 need to be formed of the same material within a range in which they can fulfill respective functions. Although the magneto-sensitive pattern portions are required to have a magneto-sensitive effect, the electrode pad portions do not need to have the magneto-sensitive effect. Therefore, to vary a current density in the magneto-sensitive pattern portions and the electrode pads, widths of the electrode pads are designed broader than those of the magneto-sensitive pattern portions. Specifically, by enlarging the width of both ends of the pattern constituted of the same material, the function of the electrode pads (conductive electrode films) can be provided. Since the same material is used, the magneto-sensitive pattern portions as the magneto-sensitive portions and the electrode pads (conductive electrode films) as the electrode portions can be simultaneously formed by one patterning process, thereby realizing a remarkably high productivity.

Each of the magneto-sensitive pattern portions 51 and 55 is usually formed as a film with a thickness of 200nm or less, which often raises a problem of corrosion resistance in operation environment. To solve the problem, at least on the magneto-sensitive pattern portions protective films are provided, so that the magneto-sensitive pattern portions are preferably protected from the environment. For the protective film, polyimide resin or novolak resin is preferable. Further, under the resin layer formed as the protective film, $SiO_2$, $Al_2O_3$ or another thin film can be provided for protecting the magneto-sensitive pattern portion (magnetoresistance effect film) in dual. This further reinforces the function of the protective film. Additionally, the surface of the magneto-sensitive pattern portion is coated with the polyimide resin or the novolak resin (for example, by a spin coating process) and then thermally cured. After the thermal treatment, the novolak resin gains a structure similar to that of bakelite and assures a high corrosion resistance.

As aforementioned, the magneto-sensitive pattern portions 51 and 55 are disposed in the opposed positional relationship on the different planes. It is natural that two or more magneto-sensitive pattern portions can be disposed on each of the opposed planes. For example, when four magneto-sensitive pattern portions are used, two magneto-sensitive pattern portions are opposed to the other two magneto-sensitive pattern portions on the different plane.

Embodiments of the invention are now described in detail.

EXAMPLE II

As substrates, a 2 mm thick glass substrate with a diameter of 3 inches (manufactured by Corning Co., Product No. 7059) and a 50 μm thick polyimide film with a diameter of 3 inches were prepared, respectively. On each of the substrates, a GMR effect film was formed of a multilayered structure of 200 Å–Ti/(15 Å–NiFeCo/20 Å–Cu)×30 with an ion beam sputtering device. The film structure is of a multilayered film having a total thickness of 1250 Å in which 30 layers each of first Ti of 200 Å, then NiFeCo alloy of 15 Å and Cu of 20 Å are sequentially laminated. For targets used when forming the GMR effect film, a target composition had a purity of 99.9% or more, and an ultimate pressure was $4 \times 10^{-7}$ Torr. After evacuation to obtain the ultimate pressure, argon gas was introduced to obtain a vacuum degree of $1.4 \times 10^{-4}$ Torr during the film forming. Either film was formed while cooling the substrate.

On both faces of the glass substrate, the aforementioned GMR effect films were formed, respectively. For the polyimide film, only on one face thereof, the aforementioned GMR effect film was formed. Subsequently, the magneto-sensitive pattern portion was formed by a photolithography process. The magneto-sensitive pattern portion was formed of a 10 μm thick and 200 μm long rectangular folded three times with an interval between lines being 10 μm. The electrode pad portion was a 50 μm square. On one face of one substrate, 800 element patterns at maximum can be formed.

After the substrate was processed and separated into individual elements, (1) in case of the glass substrate, draw wires were connected to the elements on both faces of the glass substrate, respectively. An SmCo permanent magnet was fixed in a predetermined position relative to the elements. Thus, the magnetic field sensor according to the invention was prepared (Example II-1 sample). (2) In case of the polyimide substrate, an element of polyimide substrate was adhered to each of both faces of each of four 2 mm, 1.5 mm, 1 mm, and 0.3 mm thick glass substrates, and a draw wire was connected to each element. An SmCo permanent magnet was fixed in a predetermined position relative to the elements. Thus, the magnetic field sensor according to the invention was prepared (Example II-2, II-3, II-4 and II-5 samples).

When preparing the sample of Example II-1, 800 elements were obtained from one substrate. When preparing the samples of Examples II-2 to II-5, 400 elements were obtained from one substrate (because two pieces form one element).

As a comparative example, using a glass substrate in the same manner as Example II-1, each element was prepared in which on one flat face of the substrate a pair of the GMR effect films were deposited with an interval of 2 mm (D=2 mm) therebetween, so that the element functioned as the conventional differential magnetic field sensor. From one substrate, 50 elements were obtained. To each of the elements on the glass substrate, a draw wire was connected. An SmCo permanent magnet was fixed in a predetermined position relative to the elements. Thus, the magnetic field sensor sample of Comparative Example II-1 was prepared (Comparative Example II-1 sample).

Further, prepared was another conventional magnetic field sensor which was different from the Comparative Example II-1 sample only in that a photolithography mask other than the photolithography mask used in preparing the Comparative Example II-1 sample and D=0.3 mm (Comparative Example II-2 sample). In this case, 250 elements were obtained from one substrate.

By using thus prepared magnetic field sensors (Example II-1 to II-5 samples, Comparative Example II-1 and II-2 samples), a rotation detecting test was actually conducted as follows.

Rotation Detecting Test

Two magneto-sensitive pattern portions forming each magnetic field sensor were connected in series, and a constant current of 5 mA was applied to both ends of the pattern portions. Subsequently, a voltage change was detected at midpoints. A difference in resistance change between two magneto-sensitive pattern portions is an output of the magnetic field sensor.

A gear of SUS430 was attached to a rotating shaft for detection of rotations. Specifically, four gears different from one another in cycle λ were used: gear 1 having a diameter of 61 mm and 48 teeth; gear 2 having a diameter of 46 mm and 48 teeth; gear 3 having a diameter of 61 mm and 96 teeth; and gear 4 having a diameter of 18 mm and 96 teeth.

For respective λ values, gear 1 had a value of 4 mm, gear 2 of 3 mm, gear 3 of 2 mm and gear 4 of 0.6 mm.

By using the gear 1 (λ=4 mm) for Example II-1 and II-2 samples and Comparative Example II-1 sample, the gear 2 (λ=3 mm) for ExampleII-3 sample, the gear 3 (λ=2 mm) for Example II-4 sample and the gear 4 (λ=0.6 mm) for Example II-5 sample and Comparative Example II-2 sample, rotations were detected. As a result, outputs shown in Table II-1 were obtained.

TABLE II-1

|  | λ (mm) | D = 2/λ (mm) | Output (mV) |
|---|---|---|---|
| Example II - 1 | 4 | 2 | 152 |
| Example II - 2 | 4 | 2 | 152 |
| Compar. II - 1 | 4 | 2 | 140 |
| Example II - 3 | 3 | 1.5 | 145 |
| Example II - 4 | 2 | 1 | 146 |
| Example II - 5 | 0.6 | 0.3 | 140 |
| Compar. II - 2 | 0.6 | 0.3 | 45 |

From the above results, the effect of the invention is obvious. Specifically, the magnetic field sensor of the invention has plural magneto-sensitive pattern portions for detecting magnetic fields. At least one magneto-sensitive pattern portion and other magneto-sensitive pattern portions are disposed in an opposed positional relationship on different planes. Therefore, even when the pitch of the magnetic field to be detected is narrow, a high detecting sensitivity is provided. Also, during the manufacture multiple pieces can be taken efficiently. Further, in accordance with a change in magnetic-field pitch, the interval between the magneto-sensitive pattern portions can be easily adjusted.

(3) Third Aspect of the Invention

Figure 17:
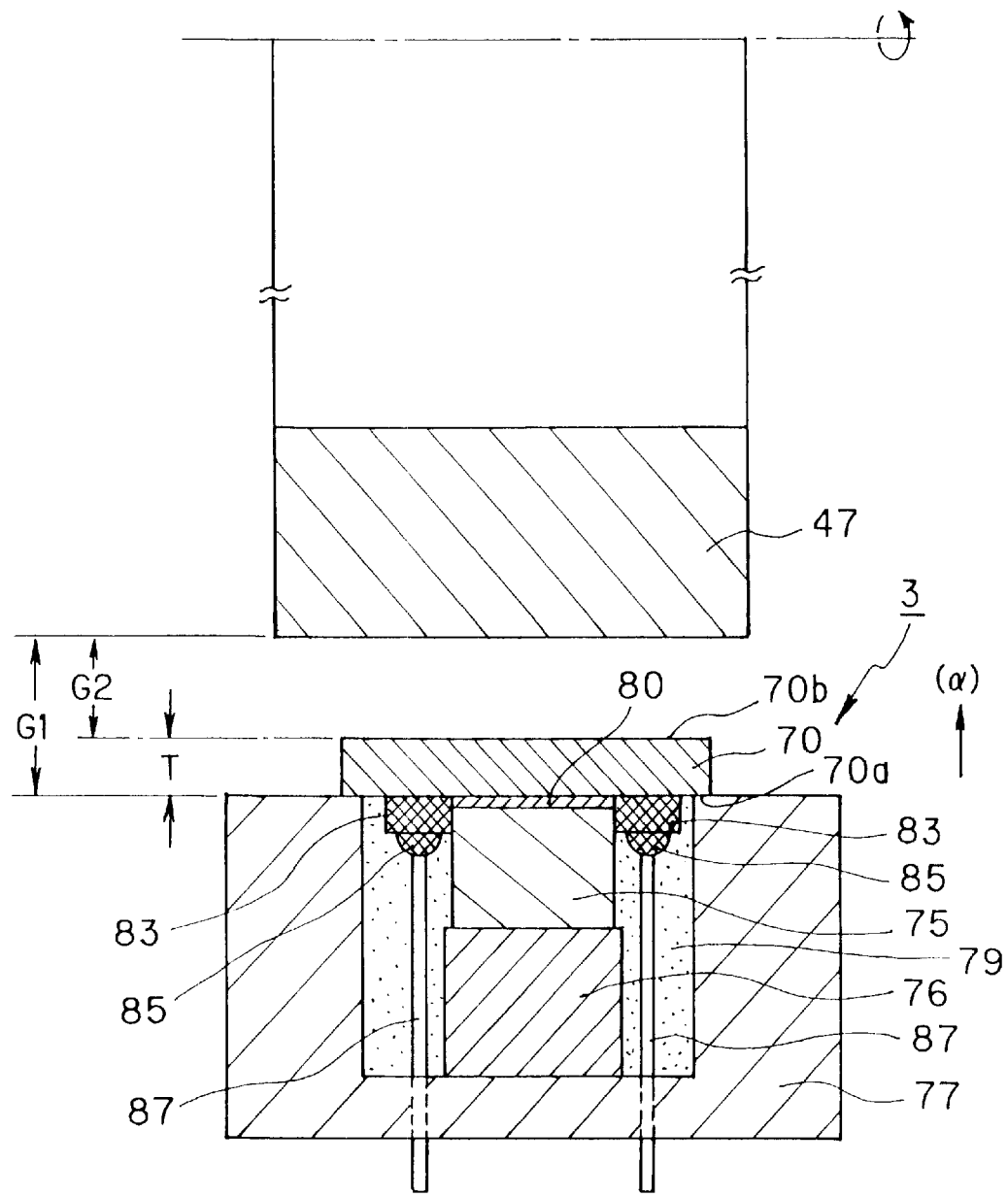
FIG. 17 is a sectional view showing a preferred embodiment of the magnetic field sensor according to the invention.

FIG. 17 shows a sectional structure of a magnetic field sensor 3 embodying the invention.

As shown in FIG. 17, the magnetic field sensor 3 of the invention is provided with a thin-film pattern 80 for detecting a magnetic field on a substrate 70. The substrate 70 in the invention is a 5 to 300 μm thick flexible substrate of resin, has on one face 70a the thin-film pattern 80 for detecting the magnetic field and has the other face 70b opposed to a detected body 47. Specifically, the other face 70b of the flexible substrate 70 with no thin-film pattern 80 formed thereon constitutes a detecting face 70b which is opposed to the detected body 47.

On both ends of the thin-film pattern 80 electrodes 83 are mounted for applying a current, respectively. These electrodes 83 are connected via solders 85 to lead wires 87.

On the thin-film pattern 80, as shown in FIG. 17, preferably a heat radiating member 75 is formed. On the heat radiating member 75 fixed is a permanent magnet 76. A periphery of the permanent magnet 76 is surrounded with a shield case 77, in order that a magnetic flux other than the magnetic flux directed from the permanent magnet 76 in a direction shown by an arrow atoward the detected body 47 is prevented from leaking. Also, between the heat radiating member 75 and the shield case 77, to assist the radiation, a highly conductive resin 79 is filled. Further, the permanent magnet 76 is closely adhered to the shield case 77 for transmitting heat from the heat radiating member 75 to the outside. Specifically, the heat generated in the thin-film pattern 80 is conducted and radiated from the heat radiating member 75 via the permanent magnet 76 to the shield case 77.

Figure 18:
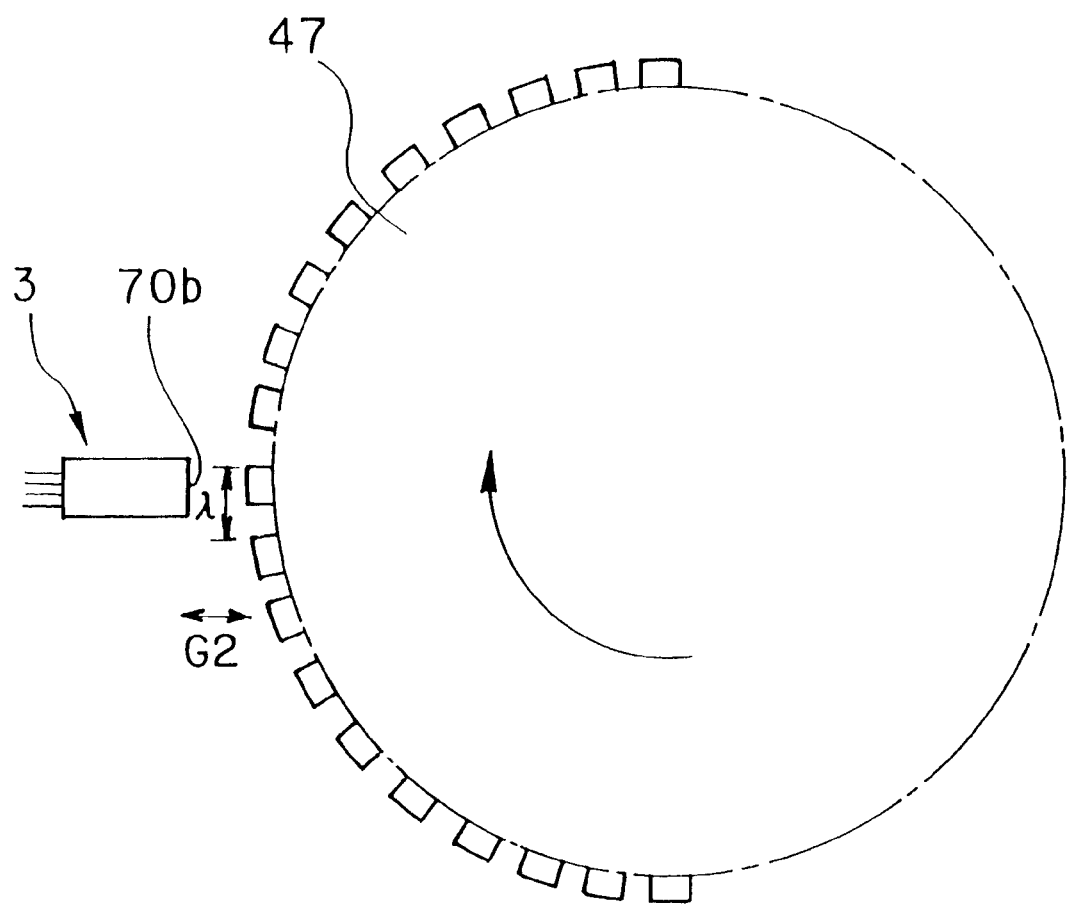
FIG. 18 is a sectional view showing an operation example of the magnetic field sensor according to the invention.

As shown in FIGS. 17 and 18, the thin-film pattern 80 is deposited with a distance of air gap G2 from a rotary gear 47 as an example of the detected body 47. The rotary gear 47 is formed of, e.g., a soft magnetic stainless SUS430 material, and is influenced by the magnetic field emitted from the permanent magnet 76. Specifically, as the rotary gear 47 rotates, the magnetic field changes with the positional relationship of irregularities which are formed on a surface of the gear. The magnetic field change is detected by the thin-film pattern 80, so that rotations of the rotary gear 47 are detected. The magnetic field change which occurs from the permanent magnet 76 via the rotary gear 47 is detected with a higher sensitivity, when the distance G1 between the rotary gear 47 and the magnetic-field detecting thin-film pattern 80 becomes smaller.

In the magnetic field sensor 3 of the invention, the flexible substrate 70 itself functions as a substrate and a protective film. A degree of the function as the protective film is superior as compared with the prior art. Specifically, in the prior art, after forming the thin-film pattern for detecting magnetic fields, the protective film is formed on the pattern. Therefore, to prevent the thin-film pattern from being damaged, the protective film is formed in rather moderate conditions. In many cases the property inherent to the protective film material cannot be fulfilled. On the other hand, the protective film of the substrate 70 according to the invention is manufactured integral with the substrate 70 beforehand. Therefore, any damage on the thin-film pattern or the like does not need to be considered. The property the material originally has can be sufficiently provided.

In the invention, different from the conventional structure, the substrate 70 needs to be thin. This is because, as clearly seen from FIG. 17, a substantial gap distance Gi is a sum of the air-gap distance G2 and a thickness T of the substrate 70.

For this, the thickness of the substrate 70 is preferably in a range from 5 to 300 $\mu$m as aforementioned, more preferably in a range from 20 to 100 $\mu$m. If the thickness is less than 5 $\mu$m, the substrate is difficult to handle during manufacture. There is another disadvantage that the function as the protective film is insufficiently performed. If the thickness exceeds 300 $\mu$m, the substantial gap distance G1 disadvantageously increases, thereby decreasing the output.

As the substrate 70 for use in the invention preferable is a thin and light plastic film superior in flexibility. Specifically, various materials known as plastic film materials are available, e.g., polyimide, polyethylene terephthalate (PET), polypropylene (PP), Teflon and the like. Above all, when considering the solder-bonding of the electrodes 83 to its ends, polyimide is preferable because it has a high thermal resistance. Additionally, for polyimide, an inexpensive substrate with a minimum surface roughness can be obtained. Also, since polyimide is superior in shock resistance, it is hardly damaged during the manufacture handling even if its thickness is 300 $\mu$m or less.

The substrate 70 can be constituted of only one material, e.g., organic polyimide. However, when a higher reliability is demanded, on its face with the magnetic-field detecting thin-film pattern 80 formed thereon or its opposite face, an inorganic thin film of silicon oxide which functions as a protective film can be deposited by a sputtering process or a sol-gel process. In this case, because of the presence of inorganic thin film, the weatherability is enhanced. However, the main portion of the substrate 70 is still constituted of a resin substrate. Such laminated substrate is also included in a scope "the flexible substrate of resin" of the invention.

Thus, the substrate 70 of the invention is not restricted to a single-material structure. Even the substrate with plural materials laminated therein may be regarded as the substrate of the invention. Also, in this laminated structure, the thickness of the substrate 70 means the total thickness of respective layers constituting the laminated body. The thickness needs to be in the range of the invention.

The flexible substrate 70 of polyimide or another resin for use in the invention has a low thermal conductivity. Therefore, if the flexible substrate is used in such a manner that much heat is generated in the element of the thin-film pattern 80, the heat is insufficiently radiated, an element temperature rises and finally the element is broken. In this respect, the radiating member 75 is formed on the thin-film pattern 80 of the invention. To sufficiently fulfill its radiating function, the heat radiating member 75 preferably has a thermal conductivity of 20 $W \cdot m^{-1} \cdot K^{-1}$ or more and a thickness of 200 $\mu$m or more. If the thermal conductivity is less than 20 $W \cdot m^{-1} \cdot K^{-1}$ or the thickness is less than 200 $\mu$m, then a sufficient radiating effect cannot be expected.

The heat radiating member 75 is preferably formed directly on the thin-film pattern 80, but may be formed via an adhesive material which has a thickness of 10 $\mu$m or less (thermal conductivity of 20 $W \cdot m^{-1} \cdot K^{-1}$ or less). Even if the thermal conductivity is 20 $W \cdot m^{-1} \cdot K^{-1}$ or less, the adhesive material or the like with a thickness of 10 $\mu$m or less does not adversely affect heat transmission because of its thinness. However, the thermal conductivity is preferably as high as possible. Especially preferable is the use of silicon resin, further silicon resin with highly thermal-conductive insulating solid particles dispersed therein.

As preferable materials for the heat radiating member 75 available are various metal materials (e.g., aluminum, copper, gold and the like), diamond, a ceramic material with a high thermal conductivity and the like. These radiating materials are preferably deposited as thin films directly on the thin-film pattern 80 by a sputtering process or another vacuum film-forming process, but may be closely adhered thereon as a bulk material via an adhesive. Also, for a portion of the heat radiating member 75 which is in contact with external atmosphere, has an enlarged radiating area to increase its radiating efficiency, irregularities may be formed on its surface. Additionally, the radiating member 75, which is formed on the thin-film pattern 80, does not inhibit the magnetic field detection in the positional relationship with the detected body.

The magnetic field sensor 3 of the invention is preferably used for detecting rotations as shown in FIGS. 17 and 18.

Especially when the distance between the detected body 47 and the thin-film pattern 80 for detecting magnetic fields, i.e., the substantial gap distance G1 (FIG. 17) is 3 mm or less, a high output property can be obtained. If the substantial gap distance G1 exceeds 3 mm, the detected output decreases. The lower limitation of the substantial gap distance G1 is not especially restricted. The detected body is desirably disposed as close as possible to the thin-film pattern. However, to prevent the rotating detected body 47 from contacting the magnetic field sensor 3 because of its running out, the lower limitation of the substantial gap distance G1 is preferably about 0.1 mm.

Figure 19:
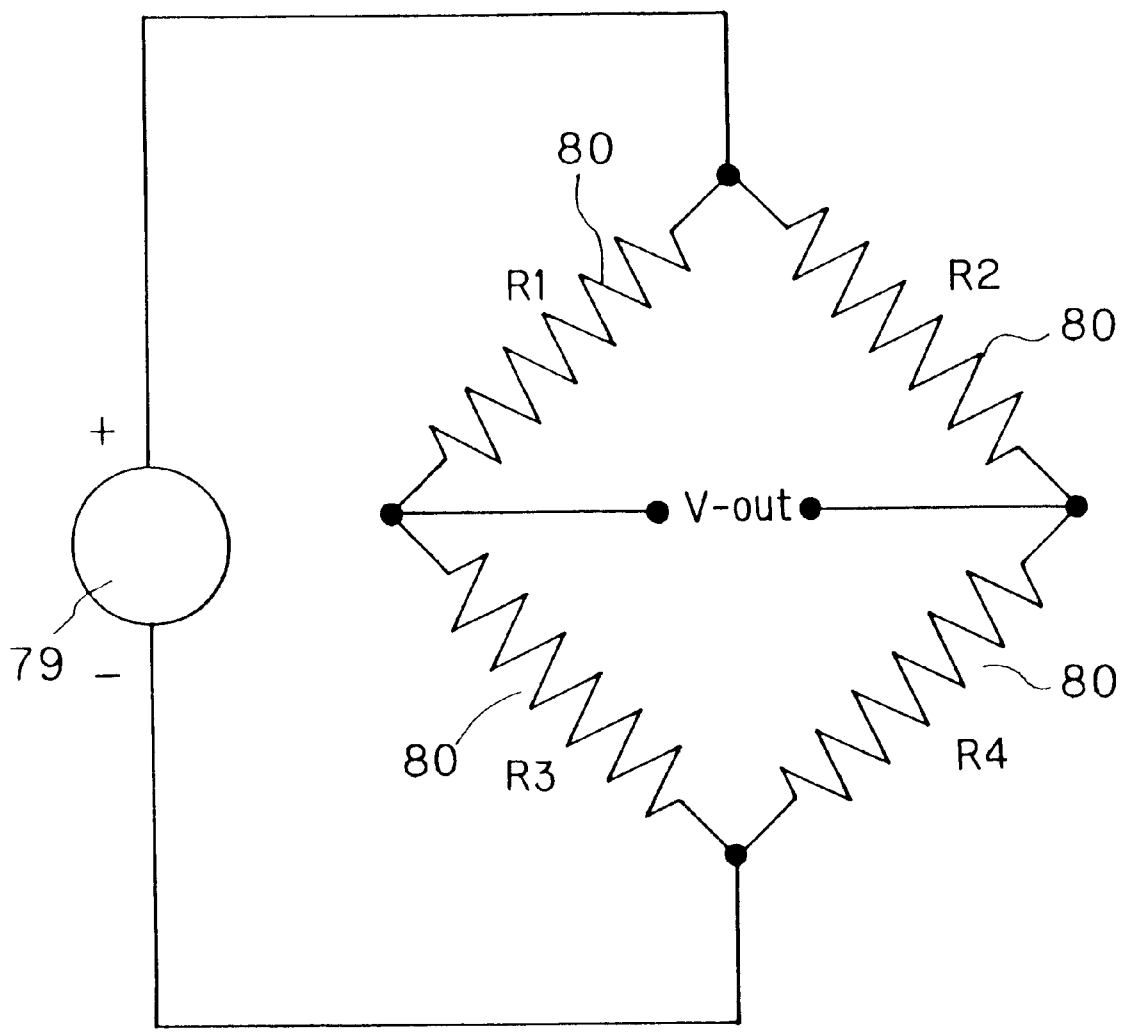
FIG. 19 is a schematic diagram showing a bridge circuit which is formed by a thin-film pattern for use in the magnetic field sensor of the invention.

The magnetic field sensor 3 of the invention has four thin-film patterns 80 (magnetic field detecting patterns 80) as shown in FIG. 19. These four thin-film patterns 80 preferably constitute a so-called bridge circuit. Specifically, when forming the four thin-film patterns 80 (magnetic field detecting patterns 80) which have four resistors R1, R2, R3 and R4, the resistors are disposed in such a manner that R1 and R4 simultaneously change in resistance with the magnetic field and, with a time difference with these resistors, R2 and R3 simultaneously change in resistance. Thus, a differential output can be obtained. It is generally known that when a magnetic-field pitch is set as $\lambda$ (FIG. 18), an interval W between the magnetic field detecting patterns (FIG. 20) is set to $\lambda/4$ or $\lambda/2$ so as to obtain a high output. In FIG. 19, numeral 79 denotes a power supply.

Figure 20:
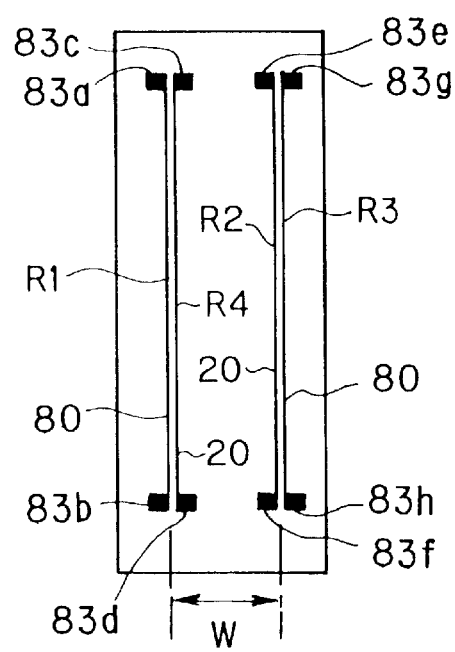
FIG. 20 is a schematic diagram showing a constitutional example of a thin-film pattern which is used in the magnetic field sensor of the invention.
Figure 21:
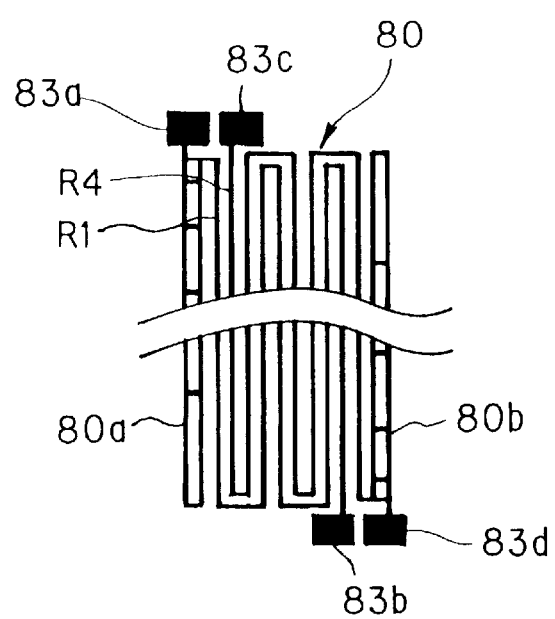
FIG. 21 is a schematic diagram showing another constitutional example of the thin-film pattern used in the magnetic field sensor according to the invention.

To form the bridge circuit, as shown in FIG. 20, a set of the thin-film patterns of the resistors R1 and R4 formed on substantially the same place is formed at the distance W from a set of the thin-film patterns of the resistors R2 and R3 formed on substantially the same place. Four magneto-sensitive patterns preferably constitute one bridge circuit. This can increase the number of elements which can be manufactured from one substrate. Additionally, in FIG. 20, for simplicity, each of the thin-film patterns (magnetic field detecting patterns) is shown in a single line, but in reality usually has a folded configuration as shown in FIG. 21 to have an increased resistance. Thus, a high output can be easily obtained. FIG. 21 shows the folded configuration of the left-side set as seen in FIG. 20, i.e., the set of the thin-film patterns of the resistors R1 and R4 formed on substantially the same place. Additionally, FIG. 21 shows a configuration which includes attempts made to finely adjust the resistors of the magnetic field detecting patterns in the final stage. Specifically, in the bridge circuit it is important that the four resistors have an equal resistance in the initial condition. Therefore, for example, in FIG. 21, to finely adjust the resistance R1 between electrodes 83*a* and 83*b*, a portion 80*a* of adjustment electrode provided on the left side of the pattern is cut with a laser or the like, to increase the resistance R1. In the same manner, to increase the resistance R4 between electrodes 83*c* and 83*d*, a portion 80*b* of adjustment electrode is cut.

As the magneto-sensitive pattern for use in the invention, the thin-film pattern 80 (magnetic field detecting pattern 80) preferably uses a ferromagnetic body. Especially preferable is a thin film which exhibits a GMR effect. Because the GMR effect thin film has a high magnetic sensitivity, and its current direction or its magneto-sensitive direction is not specified. The GMR effect film is, as introduced in Metal Artificial Lattice (edited by Hiroyasu FUJIMOR1, AGNE Technical Center, published in 1995), page 347, a multilayered film constituted of ferromagnetic films and nonmagnetic films. It is known that a change in interface diffusion in the multilayered film causes a change in resistance.

The GMR effect film is largely classified into ① an antiferromagnetic-coupled type having a ferromagnetic body/nonmagnetic conductor structure, ② an induction ferri (non-coupled) type having a high coercive-force ferromagnetic body/nonmagnetic conductor/low coercive-force ferromagnetic body structure, ③ ( a spin valve type having a antiferromagnetic body/ferromagnetic body/ nonmagnetic conductor/ferromagnetic body structure and ④ a Co/Ag non-solid solution system granular type.

These GMR effect films are largely different from one another in magnetic field intensity to be detected, i.e. the saturation magnetic field intensity of the magnetoresistance effect, because of their structures and compositions. For example, an Fe/Cr system antiferro type can detect a magnetic field of 10 KOe or more, a CoNiFe/Cu system antiferro type 0.10 e to 1 KOe, an NiFe/Cu/Co/Cu system induction ferri type about 50 e to 200 e, an FeMn/NiFe/Cu/NiFe system spin valve type several 0 e, and a granular type about 1000 e to 5 KOe. The magnetic sensitivity is obtained by dividing the maximum MR change ratio by the saturation magnetic-field intensity. Even when the maximum MR change ratio is large, the magnetic sensitivity is deteriorated if the saturation magnetic field is large. Conversely, even when the maximum MR change ratio is small, the magnetic sensitivity is good if the saturation magnetic field is very small. Therefore, to obtain an optimum magnetic sensitivity in accordance with the magnetic-field intensity to be detected, from the aforementioned various GMR effect films, a basic system is first selected. Then, the composition system is changed or a fine structure is optimized.

The thin-film pattern 80 (magnetic field detecting pattern 80) is formed by a vacuum film-forming process, e.g., an evaporation process, a sputtering process or the like.

Concrete examples are now described to detail the invention.

EXAMPLE III (Example III-1)

A 75 $\mu$m thick polyimide film with a diameter of three inches was used as a substrate. On the substrate, with an ion beam sputtering device, a 200 Å–Ti(15 Å NiFeCo/20 Å–Cu)×30 multilayered GMR effect film was formed. In the film structure, 30 layers each of first Ti with 200 Å, then NiFeCo alloy with 15 Å and Cu with 20 Å were sequentially laminated, to form the multilayered film with a total thickness of 1250 Å. For used targets, a target composition had a purity of 99.9% or more, and an ultimate pressure was $4\times10^{-7}$ Torr. After evacuation to obtain the ultimate pressure, argon gas was introduced to obtain a vacuum degree of $1.4\times10^{-4}$ Torr during the film forming. Each film was formed while cooling the substrate with water.

After forming the films, thin-film patterns were formed as the magneto-sensitive patterns by a photolithography process. Thereafter, the substrate was separated into individual elements. The thin-film pattern (magneto-sensitive pattern) was formed in a 25 $\mu$m wide and 3000 $\mu$m long rectangular folded three times with a line interval of 25 $\mu$m, and an electrode portion was formed in a 150 $\mu$m square on the end of the thin-film pattern. For the differential operation, two aforementioned patterns were formed on almost the same place to be combined. At an interval D (D=3.15 mm) from the combined pattern, another similarly combined pattern was formed. Four magneto-sensitive pattern portions in total constituted one bridge circuit.

After the substrate was processed and separated into individual elements, draw wires were soldered and connected. Subsequently, on the thin-film patterns (magneto-sensitive patterns) a 2.5 mm square lump of copper as the heat radiating member was fixed with a silicon adhesive. On the copper lump as the radiating member, a donut shape of SmCo permanent magnet (with outer diameter 2 D, inner diameter D and thickness 0.5 D) was fixed to a predetermined position and housed in a permalloy shield case. The inside of the shield case was filled and sealed with resin to complete the magnetic field sensor, which was used as Example III-1 sample. It was observed in section that the aforementioned silicon adhesive was about 3 $\mu$m thick.

Example III-2

The thickness of the polyimide film as the substrate in the Example III-1 was changed to 20 $\mu$m, but the other respects were the same as the Example III-1. Thus, Example III-2 sample was prepared.

Example III-3

The thickness of the polyimide film as the substrate in the Example III-1 was changed to 100 $\mu$m, but the other respects were the same as the Example III-1. Thus, Example III-3 sample was prepared.

A gear of SUS430 as a detected body was attached to a rotating shaft whose rotation is to be detected. Specifically, a gear with a diameter of 61 mm and 48 teeth was used.

Using the aforementioned Example III-1, III-2 and III-3 samples, rotations were detected at 300 rpm. As a result, outputs were obtained as shown in Table III-1. The air gap distance G2 was set as shown in Table III-1.

TABLE III-1

|  | Air Gap Distance G2 (mm) | Output (mV) |
| --- | --- | --- |
| Example III-1 | 1.0 | 200 |
| Example III-1 | 0.5 | 600 |
| Example III-2 | 1.0 | 230 |
| Example III-3 | 1.0 | 210 |

Comparative Example III-1

The polyimide film which was used as the substrate in Example III-1 was replaced with a 200 $\mu$m thick glass substrate, and the other respects were the same as the Example III-1. Thus, Comparative Example III-1 sample was manufactured. As a result, during the manufacture process, many cracks were made in the glass substrate. The number of finally obtained element samples was 1/10 or less of the number of Example III-1 samples which were obtained from the substrate having the same size. Additionally, although only a small number of Comparative Example III-1 samples were obtained, the property thereof was substantially the same as that of the Example III-1 sample.

Comparative Example III-2

The thickness of the polyimide film as the substrate in the Example III-1 was changed to 4 $\mu$m, but the other respects were the same as the Example III-1. Thus, Comparative Example III-2 sample was prepared. As a result, during the manufacture process the polyimide film was wrinkled. Finally, the element samples could not be completed.

Comparative Example III-3

In the Example III-1, the face with the thin-film patterns as the magneto-sensitive patterns formed on the substrate was used as a detecting face opposed to the detected body, to prepare Comparative Example III-3 sample. Using this sample, the performance evaluation was performed in the same manner as in the Example III-1. As a result, the air gap distance G2 could not be 2 mm or less, and the obtained output was 100 mV or less.

Comparative Example III-4

Through holes were first formed in an alumina substrate, and the inside thereof was filled with silver palladium paste. Thus, the conventional substrate with the through holes passed through a surface and a rear face of the substrate was prepared. On the substrate, thin-film patterns were formed in the same manner as in Example III-1. On the thin-film patterns, a polyimide resin was applied in a thickness of 30 $\mu$m and dried to form a protective film. Subsequently, cutting and assembling were performed, to complete Comparative Example III-4 sample element. By using the element, its output was measured. As a result, almost the same level of the output as that of the Example III-1 was obtained. However, the time required for preparing the Comparative Example III-4 sample was about 5 times as much as in Example III-1. It was confirmed that productivity was remarkably deteriorated. Also, a weathering test was conducted for 1000 hours in the atmosphere of 85° C. with a relative humidity of 85%, and it was confirmed that the output decreased down to 70%. In contrast, almost no decrease was found in the output of the Example III-1.

Reference Example

Different from the Example III-1 no heat radiating member was formed on the thin-film pattern as the magneto-sensitive pattern, but the other respects were the same as the Example III-1. Thus, a reference example sample was prepared. Using the reference example sample and the Example III-1 sample, a heat radiating effect comparison test was conducted. As a result, through a current of 5 mA, both samples maintained almost the same degree of property. However, through a current of 10 mA, the thin-film pattern on the reference example sample was broken. In contrast, the Example III-1 sample was not broken until a current of 15 mA was applied. That is to say, by applying the radiating member to the polyimide film, the element has enhanced safety. Further, the electric tolerance is enlarged and the application of the element can be broadened.

The effect of the invention is obvious from the aforementioned results. Specifically, in the magnetic field sensor of the invention, one face of the 5 to 300 $\mu$m thick flexible substrate of resin has a thin-film pattern for detecting magnetic fields, and the other face of the flexible substrate as the detecting face is opposed to the detected body. The magnetic field sensor has a simple structure, can be manufactured inexpensively and further has a high detecting sensitivity. More preferably, on the thin-film pattern, the 200 $\mu$m or thicker heat radiating member is formed, so that the thermal conductivity of the heat radiating member is 20 $W \cdot m^{-1} \cdot k^{-1}$ or more. Therefore, the heat generated in the thin-film pattern for detecting magnetic fields can be sufficiently radiated during operation. Thereby, the safety of the element can be improved.

(4) Fourth Aspect of the Invention

Figure 22:
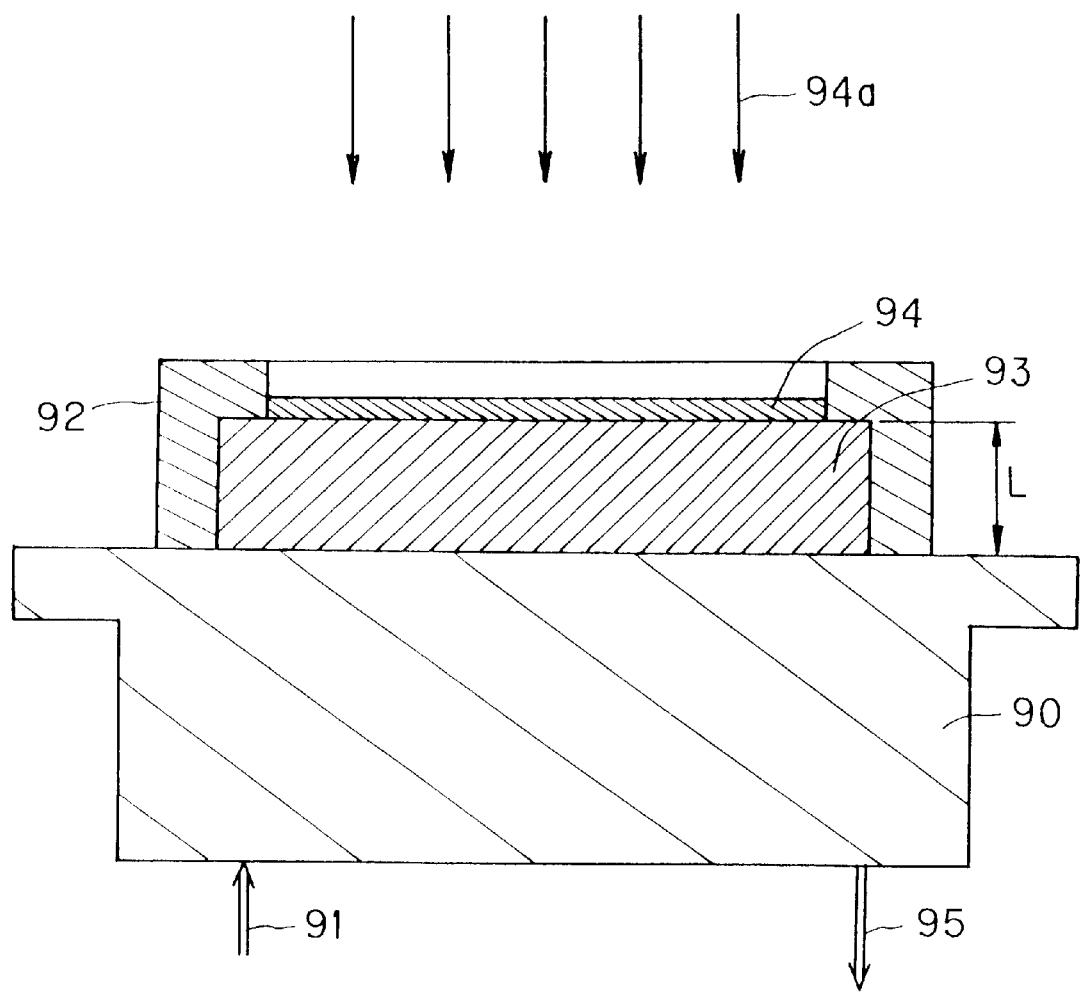
FIG. 22 is a schematic diagram showing a method of manufacturing the magnetic field sensor according to the invention, especially a process in which a GMR effect multilayered film is formed by sputtering on a flexible substrate of resin.

FIG. 22 shows a method of manufacturing the magnetic field sensor of the invention. Specifically, a flexible resin substrate 93 is mounted on a substrate fixed base 90, and on the flexible resin substrate 93 a GMR effect multilayered film 94 is formed by a sputtering process. Numeral 94a schematically denotes film-forming molecules. The flexible resin substrate 93 is usually fixed via a substrate fixing jig 92. Inside the substrate fixed base 90, a path (not shown) is formed for passing water or another cooling medium. In a lower portion of the substrate fixed base 90 formed are a cooling-medium entrance 91 to the path and a cooling-medium exit 95 from the path. By passing the cooling medium through the entrance 91. while the flexible resin substrate 93 is cooled from the substrate fixed base 90, the GMR effect multilayered film 94 can be formed on the substrate 93. The substrate fixed base 90 is formed of a material with a high thermal conductivity, e.g., aluminum or copper.

Because of space limitations, FIG. 22 does not show the multilayered condition of the GMR effect multilayered film 94. In actual, the GMR effect film has multiple layers with a thickness of 10 nm or less laminated therein. The device shown in FIG. 22 is provided in a vacuum chamber (not shown).

By using the preferable example of the device, the magnetic field sensor of the invention is manufactured as follows. Specifically, the flexible resin substrate 93 is prepared. When its thermal conductivity is k and its thickness is L (shown in FIG. 22), then a k/L value is set to $1.5 \times 10^3$ $(W \cdot m^{-2} \cdot K^{-1})$ or more. Subsequently, the flexible resin substrate 93 is mounted on the substrate fixed base 90. While cooling the flexible resin substrate 93 from the substrate fixed base 90, the magnetoresistance effect film 94 is formed. Specifically, the GMR effect multilayered film 94 with multiple layers each having a thickness of 10 nm or less laminated therein is formed by a vacuum film-forming process.

The flexible resin substrate 93 for use in the invention is preferably superior in flexibility, thin and light. For example, a substrate similar to a plastic film broadly used as a printed wiring plate or the like can be used. Specifically, available are various materials known as plastic film materials, e.g. polyimide, polyethylene terephthalate (PET), polyphenylene sulfide, polypropylene (PP), Teflon and the like. Above all, when considering soldering, wire-bonding or another bonding, a polyimide film having a high thermal resistance is preferable.

As aforementioned, the substrate 93 needs to have the ratio of thermal conductivity k and substrate thickness L, i.e. the k/L value of $1.5 \times 10^3$ $(W \cdot m^{-2} \cdot k^{-1})$ or more. The k/L value means a thermal conductance per unit area and is used as an index by which a heat radiation degree is determined. If the value is less than $1.5 \times 10^3$ $(W \cdot m^{-2} \cdot k^{-1})$, a temperature of the substrate surface (with the film 94 formed thereon) rises. In the multilayered film 94 laminated and formed on the substrate, an interlayer diffusion arises. No good GMR effect multilayered film 94 can be obtained. There arises a disadvantage that a high magnetoresistance effect change ratio (MR ratio) cannot be obtained.

The thermal conductivity of the preferable flexible resin substrate 93 in the invention is shown in Table IV-1. Also, for reference, thermal conductivity values of alumina, aluminum, brass, paper, copper, silicon and quartz glass are also shown in Table IV-1.

TABLE IV-1

| Material | Thermal Condactivity $(W \cdot m^{-1} \cdot K^{-1})$ |
| --- | --- |
| Polyimide | 0.29 |
| Teflon | 0.36 |
| Polyethylene terephthalate | 0.18 |
| Polyphenylene sulfide | 0.29 |
| Polypropylene | 0.12 |
| Alumina | 21 |
| Aluminum | 236 |
| Brass | 106 |
| Paper | 0.06 |
| Copper | 403 |
| Silicon | 175 |
| Quartz Glass | 1.4 |

As shown in Table IV-1, for example, the optimum substrate material, polyimide has a k of $0.29(W \cdot m^{-1} \cdot k^{-1})$. Therefore, to set the k/L value to $1.5 \times 10^3 (W \cdot m^{-2} \cdot k^{-1})$ or more, the substrate thickness L needs to be 200 $\mu$m or less. In the same manner, for example, polypropylene needs to have the substrate thickness of 80 $\mu$m or less. Further, although the thermal conductivity differs with a measurement temperature, in the invention the temperature is close to a room temperature.

The upper limitation of the k/L value is not especially restricted, but if the limitation is excessively large, the substrate 93 becomes too thick to handle. Therefore, by considering the convenience of handling the substrate, the substrate thickness L needs to be set for use. Usually, the upper limitation of the k/L value is about $80 \times 10^3$ $(W \cdot m^{-2} \cdot k^{-1})$.

The GMR effect film to be formed in the manufacture method according to the invention is, as introduced in Metal Artificial Lattice (edited by Hiroyasu FUJIMORI, AGNE Technical Center, published in 1995), page 347, a multilayered film constituted of laminated ferromagnetic bodies and nonmagnetic bodies, each layer having a thickness of 10 nm or less. Specifically, in the multilayered film structure, Co/Cu, NiFe/Cu, NiFeCo/Cu, CoFe/Cu, NiFeCo/Cu/Co/Cu, NiFe/Cu/Co/Cu, CoFe/Cu/NiFe/Cu or another structure is formed repeatedly five times or more, especially 5 to 100 times. Among them, especially the multilayered structure of Co/Cu, NiFe/Cu or NiFeCo/Cu is preferably used.

In the GMR effect multilayered film 94 having the multilayered film structure, each layer has a thickness of 10 nm or less, preferably 3 nm or less, so as to obtain a high MR ratio. The lower limitation of the layer thickness is not especially restricted. However, the thinner the layer is, the more easily the interlayer diffusion occurs during film formation. By considering this respect, the lower limitation of each layer thickness needs to be appropriately set. Usually, the lower limitation of each layer thickness is about 0.7 nm.

The GMR effect multilayered film 94 is formed by sputtering, evaporation, molecular beam epitaxial process (MBE process) or another vacuum film-forming process. Above all, the sputtering process is preferable. In the sputtering process, a film-forming rate can be advantageously set in a broad range, and a film-forming cost is relatively low. Therefore, the sputtering process is suitable for forming the multilayered film. When forming the multilayered film with each layer thickness of 10 nm or less, the film thickness needs to be controlled of the order of angstrom. Therefore, it is usually advantageous that the film-forming rate is set to a small value, but the productivity must be considered.

However, in the sputtering process, the average energy of sputtered atoms is as high as about 10 eV. In this case, if the film-forming rate is excessively accelerated, the substrate surface temperature rises, the interlayer diffusion in the multilayered film occurs and there arises a tendency that a good laminated film cannot be formed. Therefore, in the invention, the film-forming rate of the sputtered atoms is set 0.005 to 0.2 nm/sec., preferably 0.01 to 0.1 nm/sec. In this range, a good laminated film with a good productivity can be formed. Additionally, in the evaporation process, since the average energy of the atoms is as low as about 1 eV or less, the substrate surface temperature does not remarkably rise during film formation as compared with the sputtering process at the same film-forming rate.

Further, in the evaporation process, films in which island or columnar configurations are present easily grow. The layer structure with flat interfaces cannot be easily formed. Also, in the molecular beam epitaxial process, since an extra-high degree of vacuum is necessary, the film formation takes excess time. The device cost is also high.

In the invention, when cooling the flexible resin substrate 93 from the substrate-fixed base 90, as shown in FIG. 22 and as aforementioned, water or another cooling medium is continuously passed through the substrate-fixed base 90. In this case, the substrate 93 is preferably cooled in such a manner that a difference ΔT in temperature between the surface and the rear face of the substrate 93 becomes as large as possible. Thus, the GMR effect multilayered film 94 formed on the substrate 93 is usually processed in a predetermined pattern. After a known wiring or another subsequent process, the magnetic field sensor is formed.

Concrete examples of the invention are now described to detail the invention.

EXAMPLE IV-1

As the flexible resin substrate, a 50 μm polyimide film with a diameter of three inches was prepared. The substrate was attached to the substrate fixed base of aluminum. Subsequently, on the substrate, in a dual ion beam sputtering device, a multilayered film having a structure 200 Å-Ti(15 Å-NiFeCo/20 Å-Cu)×30 was formed. The substrate fixed base was cooled with a circulated cooling water (flow rate of five liters/min) whose temperature was controlled to 25° C. In the multilayered film structure, 30 layers each of first Ti with 200 Å, then NiFeCo alloy with 15 Å and Cu with 20 Å were sequentially laminated, to form the multilayered film with a total thickness of 1250 Å. The laminated structure of 30 NiFeCo/Cu layers functions as a magnetoresistance effect film, while the 200 Å Ti layers function as a base layer to promote crystallization and enhance adhesion of magnetic layers laminated thereon. To enhance the adhesion, before the multilayered film was formed, the ion milling of the substrate surface was performed with argon ions. For used targets, each target composition had a purity of 99.9% or more, and an ultimate pressure was $4 \times 10^{-7}$ Torr. After evacuation to obtain the ultimate pressure, argon gas was introduced to obtain a vacuum degree of $1.4 \times 10^{-4}$ Torr during the film forming.

The acceleration voltage of argon ions during film formation was 300V, a beam current (proportional to the quantity of argon ions) was 30 mA and the average film-forming rate of the NiFeCo film and the Cu film was 0.03 nm/sec.

After the multilayered film (magnetic film) was formed, by using a photoresist, exposure and image development were performed to form a magnetic film pattern. The pattern was 15 μm wide and 9000 μm long, and had a 500 μm square electrode portion formed on its end. Subsequently, through the ion milling process, the magnetic film was removed from an unnecessary portion which was not masked with the photoresist, to form the magneto-sensitive pattern (magnetoresistance effect film). A tin-plated copper wire was soldered and bonded to the electrode portion. Further, to prevent the self heating of the element during operation, on the magnetic film a heat radiation assisting 5000 μm square Cu member was adhered via an insulating adhesive layer of silicon resin or another thermally conductive material. Thus, the magnetic field sensor was completed to form Example IV-1 sample.

Subsequently, only the thickness of the flexible substrate of resin was variously changed as shown in Table IV-2, but the other respects were the same as in the manufacture method of the Example IV-1 sample. Thus, samples of Example IV-2, IV-3 and Comparative Example IV-1, IV-2 were prepared. The respective samples were measured in MR ratio (%) as follows.

Measurement of MR Ratio (%)

A current of 1 mA was applied to the samples as shown in Table IV-2. Further, by applying an external magnetic field of −300 to 3000 e into a plane, changes in resistance were measured. Resistance minimum value $\rho_{sat}$ and maximum value $\rho_{max}$ were measured. From these values, the MR ratio ΔR/R was obtained. Specifically, by using the maximum resistance $\rho_{max}$ and the minimum resistance $\rho_{sat}$ the MR ratio ΔR/R was calculated in following formula:

$$\Delta R/R = (\rho_{rax} - \rho_{sat}) \times 100 \rho_{sat}\ (\%).$$

Measurement results are shown in Table IV-2.

TABLE IV-2

|  | Substrate Thickness (μm) | k/L ($10^3$W · m$^{-2}$ · K$^{-1}$) | MR Ratio (%) |
|---|---|---|---|
| Example IV-1 | 50 | 5.8 | 11.5 |
| Example IV-2 | 100 | 3.0 | 11.5 |
| Example IV-3 | 200 | 1.5 | 9.8 |
| Compar. IV-1 | 300 | 1.0 | 2.3 |
| Compar. IV-2 | 400 | 0.3 | 1.4 |

Figure 23:
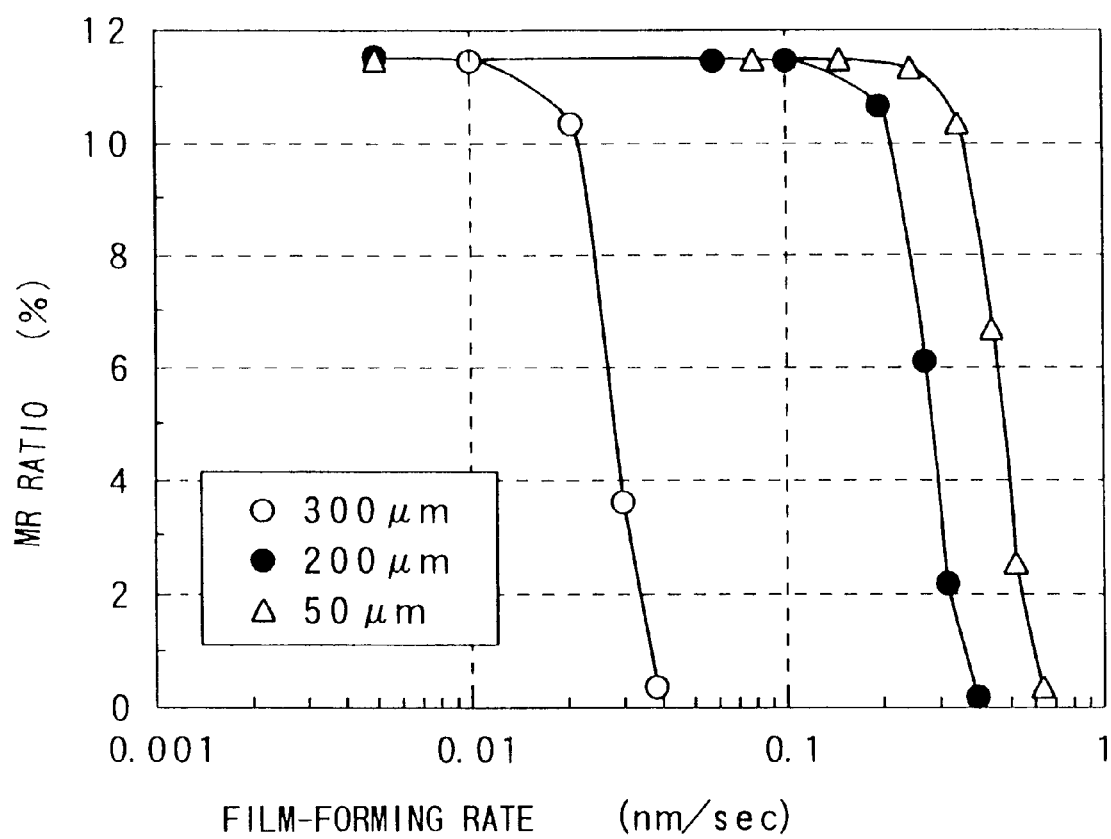
FIG. 23 is a graph showing a relationship between a film-forming rate and an MR ratio by using a thickness of a flexible substrate of resin as a parameter.

As the flexible resin substrate, a polyimide film with a diameter of three inches (three types of thickness 50 μm, 200 μm and 300 μm) was prepared. In the same manner as the Example IV-1, in the dual ion beam sputtering device, a multilayered film having a total thickness of 1250 Å was formed. However, in the Example IV-2, by changing the acceleration voltage of argon ion and the beam current, the film-forming rate was varied when conducting an experiment. After the film formation, in the same manner as in the Example IV-1, samples of the magnetic field sensor were prepared. By applying a current of 1 mA to the prepared samples, the MR ratio was measured. Results are shown in FIG. 23. As clearly seen from the graph of FIG. 23, when the average film-forming rate of the NiFeCo film and the Cu film is 0.005 to 0.2 nm/sec., by using the substrate of 200 μm thick polyimide film, a high MR ratio can be obtained. This also applies when the substrate of the 50 μm thick polyimide film is used. However, when using the substrate of 300 μm thick polyimide film, a film with a high MR ratio cannot be obtained even if the average film-forming rate of the NiFeCo film and the Cu film is lowered to about 0.03 nm/sec.

The effect of the invention is obvious from the above results. Specifically, in the method of manufacturing the magnetic field sensor according to the invention, as the substrate, the flexible resin substrate has the k/L value of $1.5 \times 10^3 (W \cdot m^{-2} \cdot k^{-1})$ or more, in which k is the thermal conductivity and L is the substrate thickness. The flexible resin substrate is mounted on the substrate fixed base. While cooling the flexible resin substrate from the substrate fixed base, as the magnetoresistance effect film, the GMR effect multilayered film with multiple layers each having a thickness of 10 nm or less laminated therein is formed by the vacuum film-forming process. Therefore, even when using the flexible resin substrate which has been difficult to be used as the substrate, the GMR effect multilayered film having smooth interlayer faces can be formed thereon. The magnetic field sensor having a remarkably high magnetoresistance change ratio (MR ratio) can be obtained.

What is claimed is:

1. A magnetic field sensor comprising:

a flexible polyimide film substrate;

a magnetic film having a magnetoresistance effect formed in a detection area on said flexible polyimide film substrate and configured to permit close positioning of the detection area relative to a magnetic field changing body to detect changes in the magnetic field; and a conductor electrode film configured to apply a current to said magnetic film and having an external connection portion including outwardly projecting bonding portions positioned to be outside of the detection area so as to not limit close positioning of the detection area relative to the magnetic field changing body, wherein said magnetic film and said conductor electrode film are formed integrally of a same material.

2. The magnetic field sensor according to claim 1 wherein the magnetic film having said magnetoresistance effect is a magnetic film which has a giant magnetoresistance effect.

3. The magnetic field sensor according to claim 1 wherein the magnetic film having said magnetoresistance effect is an antiferromagnetic-coupled type of magnetic film which exhibits a giant magnetoresistance effect.

4. The magnetic field sensor according to claim 1 wherein said flexible Polyimide film substrate is provided with at least one curved portion which is formed by a bending process in such a manner that the magnetic film for detecting the magnetic field and the external connecting portion formed on the conductor electrode film do not exist on the same plane.

5. The magnetic field sensor according to claim 1 wherein said flexible Polyimide film substrate is provided with a curved portion which is formed by a bending process for applying an external stress to the magnetic film to arbitrarily change magnetic properties.

6. A magnetic field sensor comprising:

a flexible substrate;

at least two magnetic films having a magnetoresistance effect formed in a detection area on said flexible substrate and configured to permit close positioning of the detection area relative to a magnetic field changing body to detect changes in the magnetic field; and a conductor electrode film configured to apply a current to said magnetic film and having an external connection portion including outwardly projecting bonding portions positioned to be outside of the detection area so as to not limit close positioning of the detection area relative to the magnetic field changing body, wherein said at least two magnetic films are disposed with a predetermined interval there between, said predetermined interval being adjustable by changing a curve or fold parameter of said flexible substrate.

7. The magnetic field sensor according to claim 6 wherein said magnetic films and said conductor electrode film are integrally formed of the same material.

8. The magnetic field sensor according to claim 1 or 6 wherein a protective film which is obtained by thermally treating polyimide resin or novolak resin is formed on said magnetic film.

9. The magnetic field sensor according to claim 1 or 6 which is used as a sensor for detecting a rotation.

10. A magnetic field sensor comprising:

a flexible substrate having a first face and an oppositely directed second face;

a thin-film pattern formed on said first face and configured to detect a magnetic field; and a heat radiating member with a thickness of 200 $\mu$m or more formed on said thin-film pattern, said heat radiating member having a thermal conductivity of 20 $W \cdot m^{-1} \cdot K^{-1}$ or more, wherein the flexible substrate is made of resin and has a thickness of 5 to 300 $\mu$m and the second face is configured to be disposed adjacent to a body having a characteristic that changes the magnetic field being detected.

11. The magnetic field sensor according to claim 10 wherein said flexible substrate of resin is a polyimide film.

12. The magnetic field sensor according to claim 10 wherein the thickness of said flexible substrate of resin is 20 to 100 $\mu$m.

13. The magnetic field sensor according to claim 10 wherein said thin-film pattern for detecting the magnetic field is a magnetoresistance effect film.

14. The magnetic field sensor according to claim 10 wherein said thin-film pattern for detecting the magnetic field is a giant magnetoresistance effect film constituted of a multilayered film.

15. The magnetic field sensor according to claim 10 wherein said flexible substrate of resin has a thin film of an inorganic material on a surface thereof.

* * * * *